(12) United States Patent
Krasulick

(10) Patent No.: US 9,922,967 B2
(45) Date of Patent: Mar. 20, 2018

(54) MULTILEVEL TEMPLATE ASSISTED WAFER BONDING

(71) Applicant: Skorpios Technologies, Inc., Albuquerque, NM (US)

(72) Inventor: Stephen B. Krasulick, Albuquerque, NM (US)

(73) Assignee: SKORPIOS TECHNOLOGIES, INC., Alburquerque, NM (US)

( * ) Notice: Subject to any disclaimer, the term of this patent is extended or adjusted under 35 U.S.C. 154(b) by 0 days.

(21) Appl. No.: 14/862,435

(22) Filed: Sep. 23, 2015

(65) Prior Publication Data

US 2016/0111407 A1    Apr. 21, 2016

Related U.S. Application Data

(63) Continuation-in-part of application No. 14/261,276, filed on Apr. 24, 2014, now Pat. No. 9,159,631, (Continued)

(51) Int. Cl.
*H01L 25/16*         (2006.01)
*H01L 25/00*         (2006.01)
(Continued)

(52) U.S. Cl.
CPC ............... *H01L 25/50* (2013.01); *G02B 6/13* (2013.01); *H01L 21/4857* (2013.01); *H01L 21/746* (2013.01); *H01L 21/76251* (2013.01); *H01L 21/8258* (2013.01); *H01L 21/84* (2013.01); *H01L 31/18* (2013.01); *H01L 25/167* (2013.01); *H01L 33/0079* (2013.01); *H01L 2224/16225* (2013.01); *H01L 2224/18* (2013.01); *H01L 2924/0002* (2013.01); *H01S 5/021* (2013.01); *H01S 5/0215* (2013.01); *H01S 5/0224* (2013.01)

(58) Field of Classification Search
CPC ...................................................... H01L 25/50
See application file for complete search history.

(56) References Cited

U.S. PATENT DOCUMENTS 6,242,324 B1    6/2001    Kub et al.
6,429,045 B1    8/2002    Furukawa et al.
(Continued)

FOREIGN PATENT DOCUMENTS

EP           2648906 A1    10/2013
JP       2004-063730 A     2/2004
(Continued)

OTHER PUBLICATIONS

Japanese Office Action dated Jul. 25, 2016 for Japan Application No. 2014-553476, filed Jan. 18, 2013; all pages.
(Continued)

*Primary Examiner* — Fernando L Toledo
*Assistant Examiner* — Valerie N Newton
(74) *Attorney, Agent, or Firm* — Kilpatrick Townsend & Stockton LLP

(57) ABSTRACT

Fabricating a multilevel composite semiconductor structure includes providing a first substrate comprising a first material; dicing a second substrate to provide a plurality of dies; mounting the plurality of dies on a third substrate; joining the first substrate and the third substrate to form a composite structure; and joining a fourth substrate and the composite structure.

13 Claims, 15 Drawing Sheets

Bonded Substrate Structure

Related U.S. Application Data which is a continuation of application No. 13/733,337, filed on Jan. 3, 2013, now Pat. No. 8,735,191, application No. 14/862,435, which is a continuation-in-part of application No. 14/245,191, filed on Apr. 4, 2014, now Pat. No. 9,461,026, which is a continuation of application No. 13/869,408, filed on Apr. 24, 2013, now Pat. No. 8,722,464, which is a continuation of application No. 13/527,394, filed on Jun. 19, 2012, now Pat. No. 8,445,326, which is a continuation of application No. 13/112,142, filed on May 20, 2011, now Pat. No. 8,222,084, application No. 14/862,435, which is a continuation-in-part of application No. 14/482,650, filed on Sep. 10, 2014, now Pat. No. 9,659,993, which is a continuation of application No. 13/745,577, filed on Jan. 18, 2013, now Pat. No. 8,859,394.

(60) Provisional application No. 61/583,095, filed on Jan. 4, 2012, provisional application No. 61/420,917, filed on Dec. 8, 2010, provisional application No. 61/588,080, filed on Jan. 18, 2012.

(51) Int. Cl.

| | | |
|---|---|---|
| *H01L 21/48* | (2006.01) | |
| *H01L 21/74* | (2006.01) | |
| *H01L 21/84* | (2006.01) | |
| *G02B 6/13* | (2006.01) | |
| *H01L 21/8258* | (2006.01) | |
| *H01L 21/762* | (2006.01) | |
| *H01L 31/18* | (2006.01) | |
| *H01S 5/02* | (2006.01) | |
| *H01L 33/00* | (2010.01) | |
| *H01S 5/022* | (2006.01) | |

(56) References Cited

U.S. PATENT DOCUMENTS

| | | |
|---|---|---|
| 6,583,445 B1 | 6/2003 | Reedy et al. |
| 6,667,237 B1 | 12/2003 | Metzler |
| 6,759,746 B1 | 7/2004 | Davies |
| 6,828,657 B2 | 12/2004 | Hara et al. |
| 6,959,863 B2 | 11/2005 | Figuet et al. |
| 7,256,483 B2 | 8/2007 | Epler et al. |
| 7,755,113 B2 | 7/2010 | Yamazaki et al. |
| 7,851,332 B2 | 12/2010 | Yamazaki et al. |
| 8,222,084 B2 | 7/2012 | Dallesasse et al. |
| 8,368,995 B2 | 2/2013 | Dallesasse et al. |
| 8,445,326 B2 | 5/2013 | Dallesasse et al. |
| 8,559,470 B2 | 10/2013 | Dallesasse et al. |
| 8,630,326 B2 | 1/2014 | Krasulick et al. |
| 8,722,464 B2 | 5/2014 | Dallesasse et al. |
| 2002/0106893 A1 | 8/2002 | Furukawa et al. |
| 2004/0253792 A1 | 12/2004 | Cohen et al. |
| 2005/0211465 A1 | 3/2005 | Sunohara et al. |
| 2009/0065891 A1 | 3/2009 | Dantz et al. |
| 2009/0267173 A1 | 10/2009 | Takahashi et al. |
| 2009/0278233 A1 | 11/2009 | Pinnington et al. |
| 2009/0294803 A1 | 12/2009 | Nuzzo et al. |
| 2009/0294814 A1 | 12/2009 | Assefa et al. |
| 2010/0059822 A1 | 3/2010 | Thierry et al. |
| 2010/0166360 A1 | 7/2010 | Jones et al. |
| 2011/0032964 A1 | 2/2011 | Sauer et al. |
| 2011/0085572 A1 | 4/2011 | Dallesasse et al. |
| 2011/0085577 A1 | 4/2011 | Krasulick et al. |
| 2011/0085760 A1 | 4/2011 | Han et al. |
| 2011/0244613 A1 | 10/2011 | Heck et al. |
| 2012/0057079 A1 | 3/2012 | Dallesasse et al. |
| 2012/0057609 A1 | 3/2012 | Dallesasse et al. |
| 2012/0057610 A1 | 3/2012 | Dallesasse et al. |
| 2012/0057816 A1 | 3/2012 | Krasulick et al. |
| 2012/0091594 A1 | 4/2012 | Landesberger et al. |
| 2012/0104623 A1 | 5/2012 | Pagaila et al. |
| 2012/0149148 A1 | 6/2012 | Dallesasse et al. |
| 2012/0264256 A1 | 10/2012 | Dallesasse et al. |
| 2013/0189804 A1 | 7/2013 | Marchena |
| 2013/0302920 A1 | 11/2013 | Dallesasse et al. |
| 2015/0123157 A1 | 5/2015 | Dallesasse et al. |

FOREIGN PATENT DOCUMENTS

| | | |
|---|---|---|
| JP | 2008-122926 A | 5/2008 |
| JP | 2008-233707 A | 10/2008 |
| WO | 2011-046898 A1 | 4/2011 |
| WO | 2012/078361 A1 | 6/2012 |
| WO | 2013/103769 A1 | 7/2013 |
| WO | 2013/109955 A1 | 7/2013 |

OTHER PUBLICATIONS

Final Office Action dated Aug. 3, 2016 for U.S. Appl. No. 14/482,650, filed Sep. 10, 2014; all pages.

International Search Report and Written Opinion dated Mar. 21, 2012 for International Application No. PCT/US2011/061951 filed on Nov. 22, 2011; all pages.

Notice of Allowanced dated Mar. 20, 2012 for U.S. Appl. No. 13/112,142, filed May 20, 2011; all pages.

International Search Report and Written Opinion dated Mar. 1, 2013 for International Application No. PCT/US2013/020226 filed on Jan. 4, 2013; all pages.

International Preliminary Report on Patentability dated Jul. 17, 2014 for International Patent Application PCT/US2013/020226 filed on Jan. 4, 2013; all pages.

International Search Report and Written Opinion dated May 15, 2013 for International Application No. PCT/US2013/022244 filed on Jan. 18, 2013; all pages.

International Preliminary Report on Patentability dated Jul. 31, 2014 for International Patent Application PCT/US2013/022244 filed on Jan. 18, 2013; all pages.

Non-Final Office Action dated Aug. 31, 2012 for U.S. Appl. No. 13/527,394, filed Jun. 19, 2012; all pages.

Notice of Allowance dated Jan. 29, 2013 for U.S. Appl. No. 13/527,394, filed Jun. 19, 2012; all pages.

Non-Final Office Action dated Aug. 30, 2013 for U.S. Appl. No. 13/869,408, filed Apr. 24, 2013; all pages.

Notice of Allowance dated Jan. 6, 2014 for U.S. Appl. No. 13/869,408, filed Apr. 24, 2013; all pages.

Non-Final Office Action dated Aug. 12, 2015 for U.S. Appl. No. 14/245,191, filed Apr. 4, 2014; all pages.

Pre-Interview Communication dated Apr. 29, 2015 for U.S. Appl. No. 14/562,169, filed Dec. 6, 2014; all pages.

Notice of Allowance dated Jan. 17, 2014 for U.S. Appl. No. 13/733,337, filed Jan. 3, 2013; all pages.

Extended European Search Report dated Dec. 17, 2015 for European Application No. 11847549.0 filed on Nov. 22, 2011; all pages.

Extended European Search Report dated Aug. 10, 2015 for European Application No. 13738701.5.0 filed on Jan. 18, 2013; all pages.

Extended European Search Report dated Aug. 10, 2015 for European Patent Application No. 13738701.5 filed Jan. 18, 2013; all pages.

Office Action dated Aug. 4, 2017 for Chinese Patent Application No. 201510646898.4; all pages.

Extended European Search Report dated Aug. 10, 2015 for European Patent Application No. 13738701.5, filed Jan. 18, 2013; all pages.

Processed SOI Substrate

Processed and Diced III-V Substrate

Assembly Substrate with III-V Die

MULTILEVEL TEMPLATE ASSISTED WAFER BONDING

CROSS-REFERENCES TO RELATED APPLICATIONS

This application is a continuation-in-part of U.S. patent application Ser. No. 14/261,276, filed on Apr. 24, 2014, entitled "Method and System for Template Assisted Wafer Bonding Using Pedestals," which is a continuation of U.S. patent application Ser. No. 13/733,337, filed on Jan. 3, 2013, entitled "Method and System for Template Assisted Wafer Bonding Using Pedestals," now U.S. Pat. No. 8,735,191, issued on May 27, 2014, which claims priority to U.S. Provisional Patent Application No. 61/583,095, filed on Jan. 4, 2012, entitled "Method and System for Template Assisted Wafer Bonding Using Pedestals." This application is also a continuation-in-part of U.S. patent application Ser. No. 14/245,191, filed on Apr. 4, 2014, entitled "Method and System for Template Assisted Wafer Bonding," which is a continuation of U.S. patent application Ser. No. 13/869,408, filed on Apr. 24, 2013, entitled "Method and System for Template Assisted Wafer Bonding," now U.S. Pat. No. 8,722,464, issued on May 13, 2014, which is a continuation of U.S. patent application Ser. No. 13/527,394, filed on Jun. 19, 2012, entitled "Method and System for Template Assisted Wafer Bonding," now U.S. Pat. No. 8,445,326, issued on May 21, 2013, which is a continuation of U.S. patent application Ser. No. 13/112,142, filed on May 20, 2011, entitled "Method and System for Template Assisted Wafer Bonding," now U.S. Pat. No. 8,222,084, issued on Jul. 17, 2012, which claims priority to U.S. Provisional Patent Application No. 61/420,917, filed on Dec. 8, 2010, entitled "Method and System for Template Assisted Wafer Bonding." This application is also a continuation-in-part of U.S. patent application Ser. No. 14/482,650, filed on Sep. 10, 2014, entitled "Vertical Integration of CMOS Electronics with Photonic Devices," which is a continuation of U.S. patent application Ser. No. 13/745,577, filed on Jan. 18, 2013, entitled "Vertical Integration of CMOS Electronics with Photonic Devices," now U.S. Pat. No. 8,859,394, issued on Oct. 14, 2014, which claims priority to U.S. Provisional Patent Application No. 61/588,080, filed on Jan. 18, 2012, entitled "Vertical Integration Of CMOS Electronics With Photonic Devices." The disclosures of which are hereby incorporated by reference in their entirety for all purposes.

BACKGROUND OF THE INVENTION

Advanced electronic functions such as photonic device bias control, modulation, amplification, data serialization and de-serialization, framing, routing, and other functions are typically deployed on silicon integrated circuits. A key reason for this is the presence of a global infrastructure for the design and fabrication of silicon integrate circuits that enables the production of devices having very advanced functions and performance at market-enabling costs. Silicon has not been useful for light emission or optical amplification due to its indirect energy bandgap. This deficiency has prevented the fabrication of monolithically integrated optoelectronic integrated circuits on silicon.

Compound semiconductors such as indium phosphide, gallium arsenide, and related ternary and quaternary materials have been extremely important for optical communications, and in particular light emitting devices and photodiodes because of their direct energy bandgap. At the same time, integration of advanced electrical functions on these materials has been limited to niche, high-performance applications due to the much higher cost of fabricating devices and circuits in these materials.

Thus, there is a need in the art for improved methods and systems related to composite integration of silicon and compound semiconductor devices.

SUMMARY OF THE INVENTION

Embodiments of the present invention relate to optical systems and methods and systems for template assisted bonding of semiconductor wafers, also referred to as substrates. As described herein, embodiments of the present invention relate to a method and system for performing template assisted bonding using one or more pedestals. More particularly, embodiments of the present invention relate to methods and apparatus for wafer-scale bonding of photonic devices to SOI wafers including CMOS devices. Embodiments of the present invention have wider applicability than this example and also include applications for heterogeneous growth of semiconductor materials or integration of III-V materials for high-speed devices on silicon.

According to an embodiment of the present invention, a method of fabricating a composite semiconductor structure is provided. The method includes providing a first substrate comprising a first material and having a first surface and forming a plurality of pedestals extending to a predetermined height in a direction normal to the first surface. The method also includes attaching a plurality of elements comprising a second material to each of the plurality of pedestals, providing a second substrate having one or more structures disposed thereon, and aligning the first substrate and the second substrate. The method further includes joining the first substrate and the second substrate to form the composite substrate structure and removing at least a portion of the first substrate from the composite substrate structure.

According to another embodiment of the present invention, a method of fabricating a composite semiconductor structure is provided. The method includes providing an SOI substrate including a plurality of silicon-based devices and providing a plurality of photonic dies, each photonic die including one or more photonics devices. The method also includes providing an assembly substrate having a plurality of pedestals extending to a predetermined height from the assembly substrate and mounting each of the plurality of photonic dies on one of the plurality of pedestals. The method further includes aligning the SOI substrate and the assembly substrate and joining the SOI substrate and the assembly substrate to form the composite substrate structure.

According to yet another embodiment of the present invention, a method of fabricating a composite semiconductor structure is provided. The method includes providing a first substrate comprising a first material and having a first surface and forming a plurality of pedestals extending to a predetermined height in a direction normal to the first surface. The method also includes attaching a plurality of elements comprising a second material to each of the pedestals and providing a second substrate having one or more optical structures disposed thereon. The method further includes aligning the first substrate and the second substrate, joining the first substrate and the second substrate to form the composite substrate structure, and removing at least a portion of the first substrate from the composite substrate structure.

According to an embodiment of the present invention, methods that enable wafer-scale processing in silicon photonics are provided. As an example, according to an embodiment of the present invention, a method of fabricating a composite semiconductor structure is provided. The method includes providing an SOI substrate including a plurality of silicon-based devices, providing a compound semiconductor substrate including a plurality of photonic or other devices such as high-speed transistors, and dicing or otherwise forming the compound semiconductor substrate to provide a plurality of photonic dies. Each die includes one or more of the plurality of photonic or electronic devices. The method also includes providing an assembly substrate, mounting the plurality of compound semiconductor dies on predetermined portions of the assembly substrate, aligning the SOI substrate and the assembly substrate, joining the SOI substrate and the assembly substrate to form a composite substrate structure, and removing at least a portion of the assembly substrate from the composite substrate structure.

According to another embodiment of the present invention, a method of growing a compound semiconductor structure on a silicon-based substrate is provided. The method includes providing an SOI base wafer having a bonding surface, providing a seed wafer, and dicing the seed wafer to provide a plurality of seed dies. The method also includes providing a template wafer, mounting the plurality of seed dies on the template wafer, and bonding the template wafer to the SOI base wafer. The plurality of seed dies are joined to the bonding surface of the SOI base wafer. The method further includes removing at least a portion of the template wafer, exposing at least a portion of a surface of the plurality of seed dies, and growing the compound semiconductor structure on the exposed seed dies.

According to a particular embodiment of the present invention, a method of fabricating a composite semiconductor structure is provided. The method includes providing an SOI substrate including a plurality of silicon-based devices and providing a compound semiconductor substrate including a plurality of photonic devices. The method also includes dicing the compound semiconductor substrate to provide a plurality of photonic dies. Each die includes one or more of the plurality of photonics devices. The method further includes providing an assembly substrate, mounting the plurality of photonic dies on predetermined portions of the assembly substrate, aligning the SOI substrate and the assembly substrate, joining the SOI substrate and the assembly substrate to form a composite substrate structure, and removing at least a portion of the assembly substrate from the composite substrate structure.

Numerous benefits are achieved using the present invention over conventional techniques. For example, in an embodiment according to the present invention, the use of a template wafer allows more expensive III-V materials to be used sparingly, for example, only where required to implement a specific device function. Thus, the cost structure of the finished product is improved by embodiments described herein by minimizing the quantity of III-V or other materials needed. Additionally, multiple levels of optical interconnects can be formed in a photonic integrated circuit according to some embodiments by routing optical signals in patterned regions of the template wafer that remain after an anneal process is employed to create a split plane. The attach and split process described herein may be employed a single time or multiple times.

In a particular embodiment, multiple bonding processes are employed and three dimensional structures of alternating crystalline silicon with interspersed planes of III-V, II-VI, or other materials, are formed. Yet another benefit provided by embodiments of the present invention are that alignment to a silicon base wafer is performed on a wafer-scale basis. Additionally, definition of active stripes or regions may be performed on the III-V or other material after the wafer bonding process, significantly relaxing alignment tolerances.

Depending upon the embodiment, one or more of these benefits may exist. These and other benefits have been described throughout the present specification and more particularly below. Various additional objects, features and advantages of the present invention can be more fully appreciated with reference to the detailed description and accompanying drawings that follow.

DETAILED DESCRIPTION OF SPECIFIC EMBODIMENTS

According to the present invention, methods and systems related to template assisted bonding of semiconductor wafers are provided. Merely by way of example, the invention has been applied to a method of bonding III-V dies (or device regions for more complex circuits) to a substrate at a wafer level using an assembly substrate (also referred to as a template wafer). The method and apparatus is applicable to a variety of semiconductor processing applications including wafer-scale processing of photonics integrating silicon-devices and silicon circuits integrating high-speed electronic functions with compound semiconductor devices.

The inventors have determined that the commercial significance of silicon photonics will be enhanced if cost and power can be reduced relative to discrete implementations while not sacrificing performance. According to embodiments of the present invention, performance parity is achieved by integrating III-V materials onto the silicon photonic wafer as a wafer-scale process. As described more fully throughout the present specification, template-assisted bonding provides a wafer-scale processing paradigm for the composite integration of III-V materials with silicon or silicon-on-insulator that is amenable to batch processing (cassette to cassette).

Without limiting embodiments of the present invention, the following definitions are used to define processes and structures described herein:

Composite Bonding: A wafer bonding process using a combination of metal to metal, metal interface layer assisted, and/or direct semiconductor bonding to achieve a combination of the desirable characteristics of each of these techniques. Benefits provided by these techniques include, without limitation, strength for a metal to metal bond, ability to accommodate thermal expansion coefficient mismatches and surface roughness for metal interface layer assisted, and optical transparency for direct semiconductor bonding.

Composite Semiconductor-on-Insulator (C-SOI): A silicon photonic wafer that combines wafer-bonded III-V materials on a silicon-on-insulator substrate to create a composite of III-Vs, silicon, and potentially other materials. The resultant stack is referred to as a composite semiconductor-on-insulator wafer, or a C-SOI wafer or substrate.

Template-Assisted Bonding: Wafer bonding of pieces at a wafer-scale level through the intermediate step of producing a template. As described throughout the present specification, in an embodiment, an intermediate carrier (also referred to as an assembly substrate), for example, a carrier that has been prepared to include an implant region to enable a cleaner separation of the material on the template from the carrier substrate, is utilized.

Figure 1:
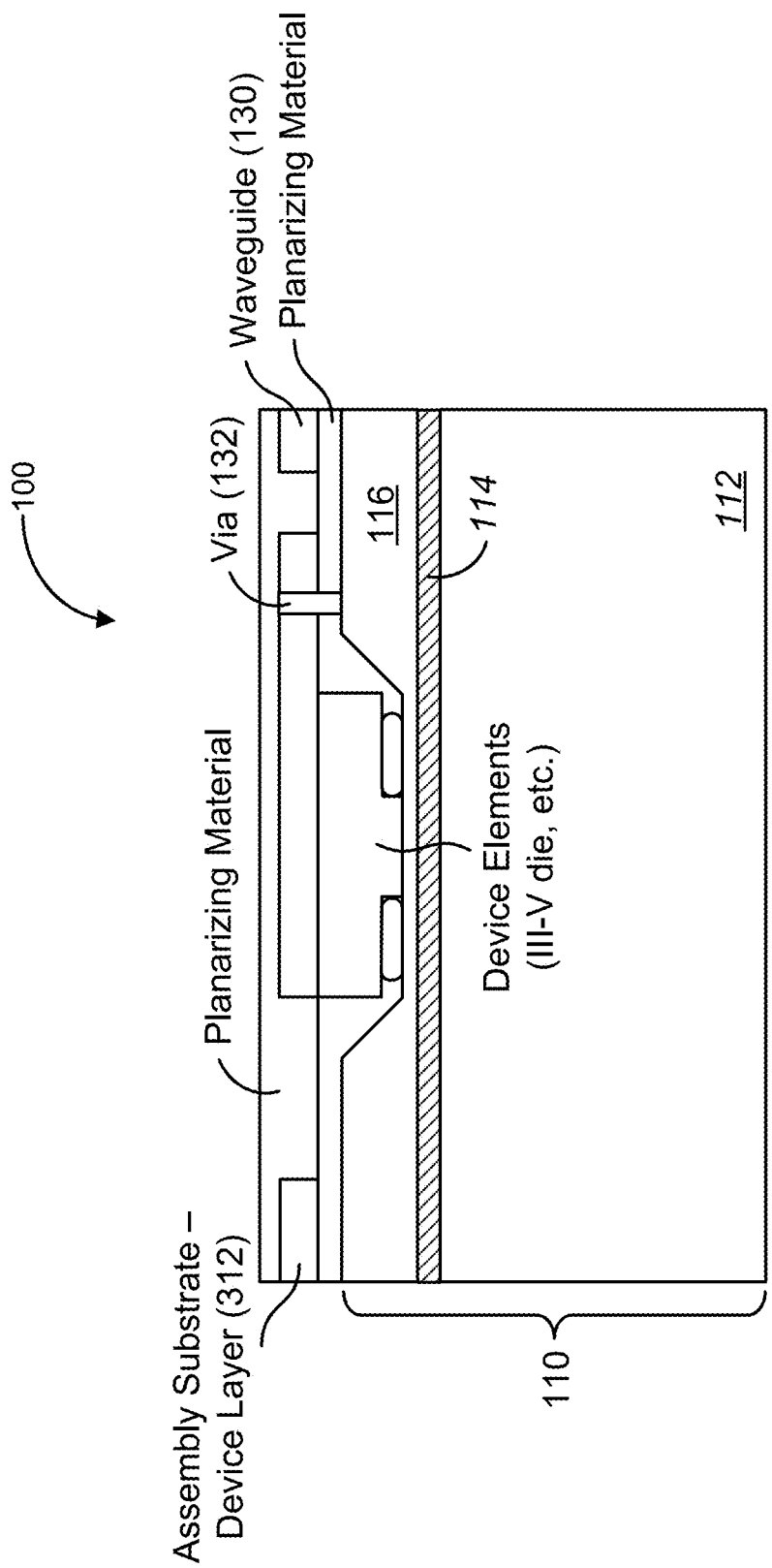
FIG. 1 is simplified schematic diagram of an integrated optoelectronic device according to an embodiment of the present invention.

FIG. 1 is simplified schematic diagram of an integrated optoelectronic device 100 according to an embodiment of the present invention. Referring to FIG. 1, an SOI substrate 110 (also referred to as a base wafer) including a silicon handle wafer 112, an oxide layer 114 and a single crystal silicon layer 116 is processed to form one or more electronic circuits, photonic elements such as waveguides, multimode interference couplers, gratings, index tuning elements, Mach-Zehnder modulators (MZMs), or the like. As an example, CMOS circuits can be fabricated in silicon layer 116 providing for a wide variety of electrical device functionality. In the schematic diagram illustrated in FIG. 1, these circuits and elements are formed in layer 116 although the actual device components can extend outside layer 116. Although an SOI substrate 110 is illustrated in FIG. 1, some embodiments utilize a silicon wafer in place of the SOI substrate.

A waveguide 130 formed in the device layer of the assembly substrate (described more fully throughout the present specification) is illustrated in FIG. 1. As shown in FIG. 1, this device layer provides for multiple functionalities, including an electrical interconnect layer connected to CMOS circuitry formed in the single crystal silicon layer 116 of the SOI substrate through via 132. The waveguide 130 can be an optical waveguide defined in the device layer to interconnect optical devices or to bring the optical signal from one section of the structure to another section. Thus, the device layer of the assembly substrate the template wafer itself can be processed into several different types of functional applications. One of ordinary skill in the art would recognize many variations, modifications, and alternatives.

Figure 3A:
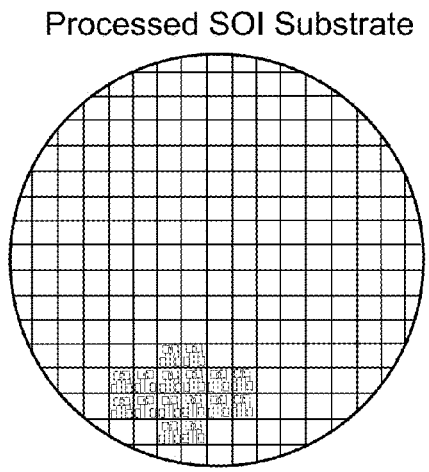
FIG. 3A is a simplified plan view of a processed SOI substrate according to an embodiment of the present invention.

In one embodiment, the substrate can be removed from the standard silicon process flow (e.g., a CMOS process flow) prior to metal patterning. The lack of metal patterning enables higher temperature processing to be performed during the template assisted bonding process described herein. In this embodiment, the substrate can be returned to the fabrication facility or other suitable processing facility for completion of the standard silicon process after the template assisted bonding process. FIG. 3A is a simplified plan view of a processed SOI substrate corresponding to SOI substrate 110 illustrated in FIG. 1. The processed SOI substrate includes a plurality of device regions illustrated by the grid shown in FIG. 3A.

Figure 3B:
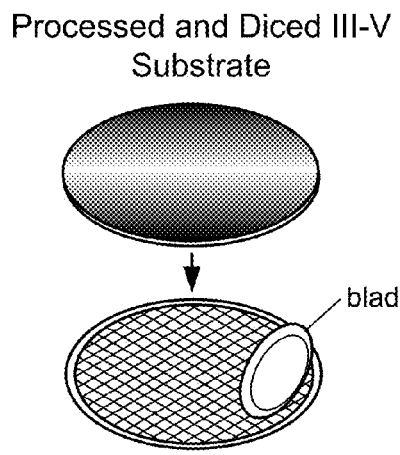
FIG. 3B is a simplified perspective view of a processed III-V substrate and dicing of the processed III-V substrate according to an embodiment of the present invention.

FIG. 3B is a simplified perspective view of a processed III-V substrate and dicing of the processed III-V substrate according to an embodiment of the present invention. In the embodiment illustrated in FIG. 3B, dicing is performed using a saw blade but embodiments of the present invention are not limited to this particular dicing method and other techniques are included within the scope of the present invention. Typically, III-V substrates are smaller than the processed SOI substrate illustrated in FIG. 3A. After the dicing operation illustrated in FIG. 3B, a plurality of III-V dies are available for mounting to an assembly substrate as described more fully throughout the present specification. III-V dies can include elements suitable as gain chips, photodetectors, MZMs, circulators, or the like. Although dicing is discussed in relation to some embodiments, the present invention is not limited to this particular technique for separating materials into smaller sections for bonding. As will be evident to one of skill in the art, dicing is one method suitable for use with embodiments of the present invention and other separation methods such as cleaving, etching, or the like are included within the scope of the present invention and may be utilized as well.

Figure 3C:
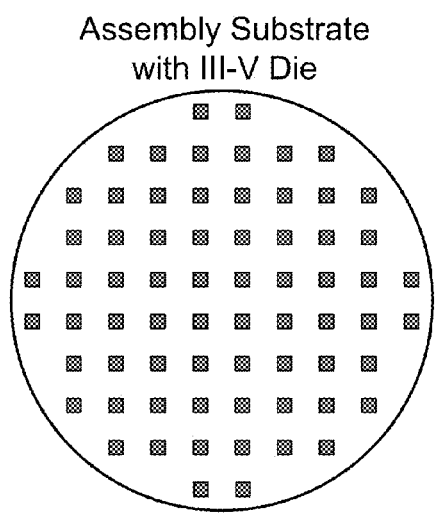
FIG. 3C is a simplified plan view of an assembly substrate including a plurality of III-V die according to an embodiment of the present invention.
Figure 3D:
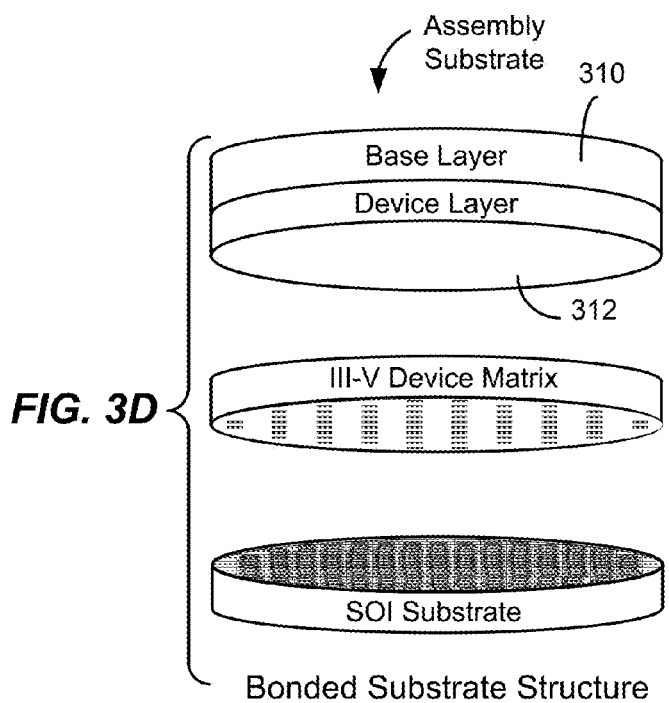
FIG. 3D is a simplified exploded perspective diagram illustrating joining of the processed SOI substrate and assembly substrate including a plurality of III-V die according to an embodiment of the present invention.

FIG. 3C is a simplified plan view of an assembly substrate including a plurality of III-V die according to an embodiment of the present invention. Although not illustrated in FIG. 3C, the assembly substrate, also referred to as a template substrate or wafer is processed to provide a mechanism for wafer separation. In an embodiment, the assembly substrate (e.g., a silicon substrate that is the same size as the processed SOI substrate) is oxidized and ion implanted (e.g., using $H_2^+$ or $He_2^+$ ions) to form a wafer separation region (i.e., a fracture plane) at a predetermined depth into the assembly substrate. Such a process is illustrated in the assembly substrate—base layer 310 (also referred to as a base region) and assembly substrate—device layer 312 (also referred to as a device region) as shown in FIG. 3D. The III-V Device Matrix is illustrated as exploded to highlight that the III-V devices are joined to the device layer 312 and do not form a continuous layer, but a set of devices bonded to the device layer 312 of the assembly substrate. According to the illustrated embodiment, implant separation is used to accomplish substrate removal, but it is also possible to physically remove the bulk of the template wafer by mechanical thinning or other lapping techniques.

In FIG. 3C, the plan view includes the surface of the base layer adjacent the dies and the various III-V dies. The device layer of the assembly substrate can then be patterned with alignment features and/or bonding locations for attachment of the III-V dies as illustrated in FIG. 3C. In addition to III-V die, other devices, structures, and materials can be joined to or mounted on the assembly substrate as appropriate to the particular application. In some embodiments, the strength of the bond between the III-V dies and the assembly substrate is varied as appropriate to the particular application. Thus, both strong and weak bonding between these elements is included within the scope of the present invention. Examples of the other materials that can be attached to the defined bonding locations on the assembly substrate are one or multiple III-V materials, II-VI materials, magnetic materials, silicon-based materials (e.g., silicon material with different characteristics than the silicon from the assembly substrate), nonlinear optical materials, or other materials that provide a functional enhancement to the functions provided by the devices on the processed SOI substrate. Attachment of the III-V dies or other materials can be performed using a pick and place tool or other suitable die attach systems.

FIG. 3D is a simplified exploded perspective diagram illustrating joining of the processed SOI substrate and the assembly substrate including the plurality of III-V die according to an embodiment of the present invention. The III-V dies mounted on the assembly substrate are represented as a III-V device matrix in FIG. 3D and one of skill in the art will appreciate that reference to a matrix indicates, not a continuous layer, but a dimension in which the III-V dies are distributed. As illustrated in FIG. 3D, the devices on the processed SOI substrate are aligned with the III-V die mounted on the assembly substrate and the two substrates are joined to form a bonded substrate structure. As will be evident to one of skill in the art, alignment of the elements provides for placement of the III-V dies mounted on the assembly substrate relative to the electronic and/or photonic circuits present on the SOI substrate. Several methods of performing wafer bonding are included within the scope of the present invention, including methods discussed in U.S. patent application Ser. No. 12/902,621, filed on Oct. 12, 2010, the disclosure of which is hereby incorporated by reference in its entirety for all purposes.

In a particular embodiment, an interface assisted bond is formed between the semiconductor elements (e.g., between the layers of the SOI substrate and the III-V dies) in which an intermediate layer (e.g., $In_xPd_y$, for example, $In_{0.7}Pd_{0.3}$), provides an ohmic contact and optical quality including transparency, stress accommodation, and other benefits.

Figure 3E:
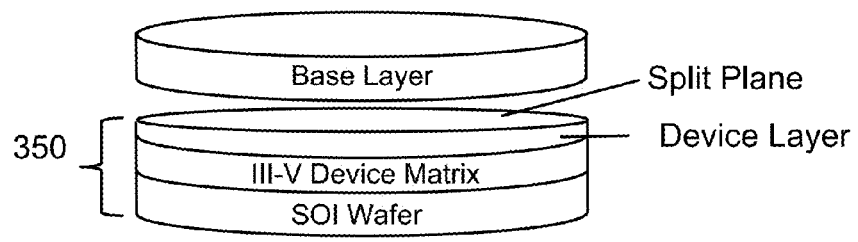
FIG. 3E is a simplified perspective view of removal of a portion of the assembly substrate from the bonded substrate structure illustrated in FIG. 3D.

FIG. 3E is a simplified perspective view of removal of the base region of the assembly substrate from the device region of the assembly substrate portion of the bonded substrate structure illustrated in FIG. 3D. In an embodiment, an ion implantation process performed on the assembly substrate as discussed above allows for wafer separation of a portion of the assembly substrate (the base region) to occur as illustrated in FIG. 3E. As shown in FIG. 3E, the base region of the assembly substrate is removed, and may be used again in a manner analogous to substrate reuse associated with SOI substrate fabrication and reuse techniques. Although the wafer separation process is illustrated as following the substrate bonding process, this is not required by the present invention and wafer separation may be performed before, during, or after the wafer bonding process.

In some embodiments, the processes illustrated in FIGS. 3D and 3E are combined as heat from the bonding process causes the assembly substrate to split along the plane defined by the peak of the implanted species. In other embodiments, the assembly substrate is split during an anneal process that is performed either prior to or following the bonding process. One of ordinary skill in the art would recognize many variations, modifications, and alternatives. In yet other embodiments, lapping and/or polishing steps are utilized to move the base layer portion.

The processed SOI substrate, the attached III-V die matrix, and the device region of the assembly substrate, which can include a thin silicon layer or an oxide/silicon layer associated with the device region of the assembly substrate, as illustrated in FIG. 3E can be polished using a CMP process or other polishing process to remove any residual roughness produced by the splitting process. Thus, embodiments provide a substrate 350 that includes a silicon—III-V—silicon stack suitable for use in fabricating integrated optoelectronic devices. The substrate 350 resulting in FIG. 3E, can be further processed to define additional optical or electronic devices in the thin silicon layer. Electrical interconnects are made to the other materials as needed. Referring to FIG. 1, a portion of the device layer of the assembly substrate remains on the left portion of the device and another portion is processed to form a waveguide. A via is illustrated as passing through the device layer of the assembly substrate to make electrical contact to silicon layer 116 on the processed SOI substrate. Planarizing material is deposited to planarize and passivate the surfaces of the various device elements. Examples of planarizing material include silicon dioxide, silicon nitride, silicon oxynitride, polyimide or other polymeric materials, spin-on glasses, cyclotene, pyraline, or the like. Planarizing materials may be first applied to the base wafer structure 110 and then patterned to open access areas through which the device elements may be attached to the base wafer.

As an example, if the device region of assembly substrate includes a silicon layer (e.g., single crystal silicon), this silicon layer can be removed or patterned to form optical interconnects on the chip. This enables optical routing to be provided in a process that can be repeated for multiple optical levels. In embodiments in which the processed SOI substrate was removed from the fabrication facility prior to metallization processes, it is returned for those process steps to be performed.

As an alternative to the wafer splitting based on an ion implantation process as illustrated in FIG. 3E, other embodiments utilize bulk removal of a portion of the assembly substrate, for example, using a chemical mechanical polishing (CMP) process. This technique can be useful when thicker silicon top layers are desired in the finished structures. One of ordinary skill in the art would recognize many variations, modifications, and alternatives.

In an embodiment, the substrate 350 including a number of integrated optoelectronic devices as illustrated in FIG. 3E can be used as a new assembly substrate in order to create a multi-layer stack of silicon and other materials by repeating the processes illustrated in FIGS. 3C-3E. Patterning and planarization may be performed as the processes are repeated to define multiple layers of optical interconnects. After processing, the substrate 350 can be diced to provide singulated dies (such as the device illustrated in FIG. 1) for testing and use.

Figure 10:
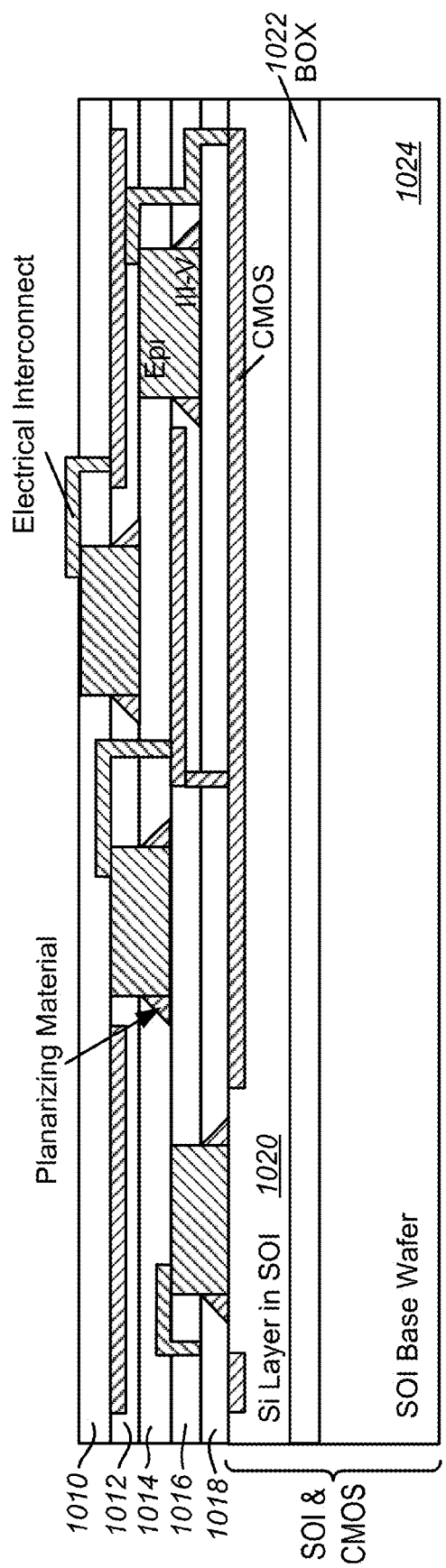
FIG. 10 is a simplified schematic diagram of a multilayer structure fabricated according to an embodiment of the present invention.

Utilizing the template assisted bonding process illustrated in FIGS. 3A-3E, a variety of devices including III-V dies, other materials suitable for use as gain chips, photodetectors, MZMs, circulators, high-speed electronic devices, or the like, are mounted on the assembly substrate, which can be a hydrogen implanted silicon wafer that is patterned with alignment targets and/or material attach sites. In some implementations, hydrogen, helium, boron, or other implantation processes are performed prior to patterning to define the split plane illustrated in FIG. 3E along which the SOI wafer splits, for example, during an anneal step. Referring to FIG. 3E, the illustrated embodiment includes a thin silicon device layer, creating a silicon—III-V—silicon stack. The device layer can be removed or patterned to form optical interconnects on chip and to enable optical routing, which can be repeated for multiple optical levels. As an example, traces could be patterned in the silicon to form, effectively, an upper plane of optical waveguides. As another example, connections could be formed between multi-core processors in the SOI substrate and optical waveguides in the device layer. In some embodiments, the assembly substrate can be repolished and reused. As illustrated in FIG. 10, the processes described herein can be repeated to create multi-layer stacks of III-V dies and silicon, allowing for multi-layer optical interconnects to be formed.

Figure 2:
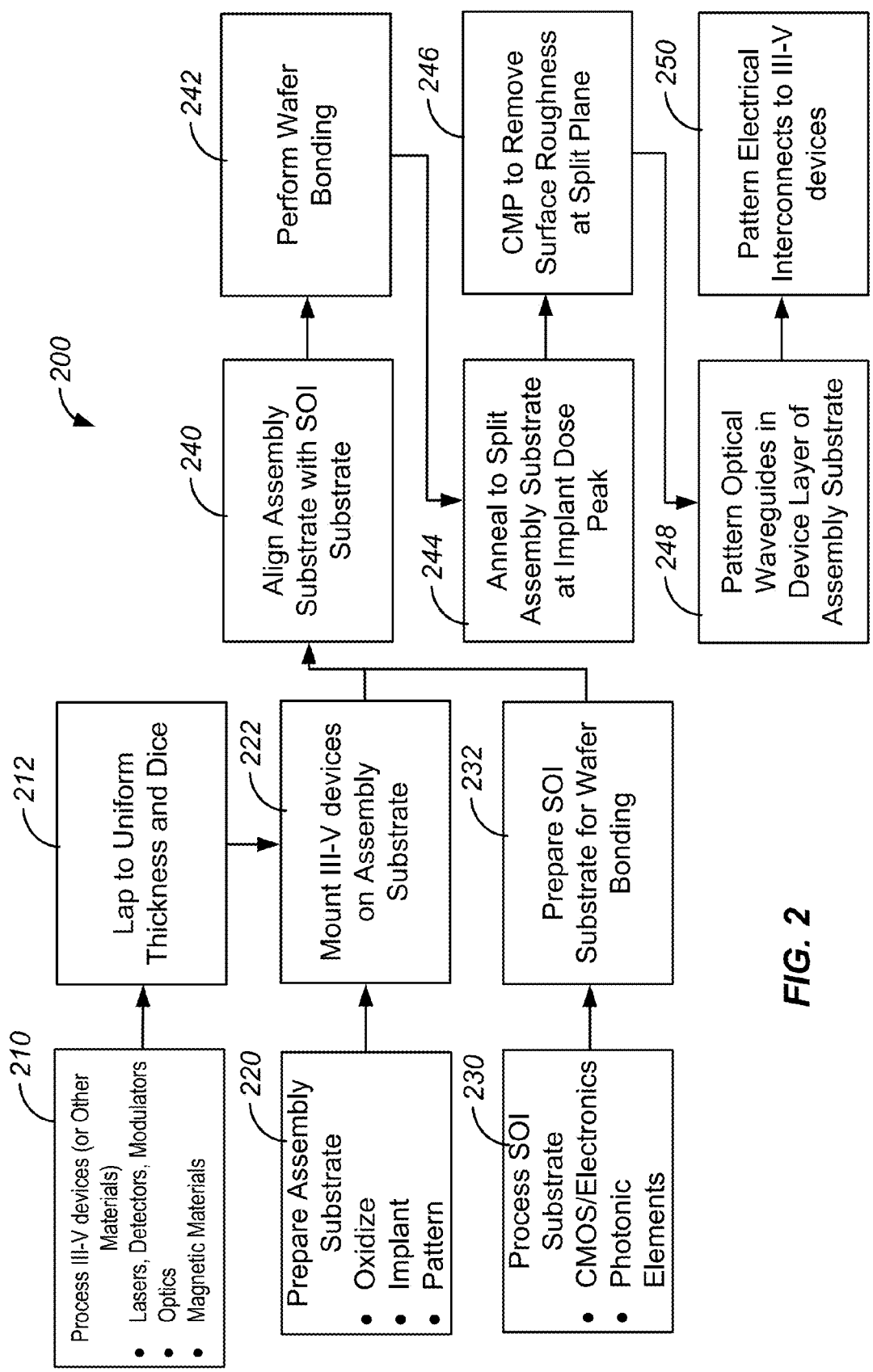
FIG. 2 is a simplified flowchart illustrating a method of fabricating integrated optoelectronic devices according to an embodiment of the present invention.

FIG. 2 is a simplified flowchart illustrating a method 200 of fabricating integrated optoelectronic devices according to an embodiment of the present invention. The method includes processing a III-V substrate to form III-V devices (210), such as lasers, optical gain media, detectors, modulators, optical elements, or the like. In addition to the formation of III-V devices other materials can be processed to form magnetic device elements for devices such as optical circulators or isolators, other optoelectronic elements, and the like. After device processing, the III-V substrate can be lapped to form a uniform thickness and diced to provide III-V dies (212). Lapping is not required.

The method also includes preparing an assembly substrate (220). In an embodiment, a silicon substrate is oxidized, implanted, and patterned to provide mounting locations for the III-V dies discussed above (222). The assembly substrate in this embodiment includes a base region and a device region separated by a split plane defined by the peak of the implant dose (e.g., formed during a hydrogen implantation process). The patterning process can include definition of metal patterns on the template wafer that define locations where the semiconductor pieces (e.g., III-V semiconductor devices) are bonded. In some embodiments, in addition to or in place of metal patterns, targets are formed during the patterning process to provide an indication of locations at which the semiconductor pieces (e.g., III-V semiconductor devices) are directly bonded. As described more fully throughout the present specification, the device region is bonded to the processed SOI substrate and used for device fabrication and the base region is removed and potentially reused. An SOI substrate is processed (230) to provide CMOS devices, electronics, photonic elements, and the like. The SOI substrate is prepared for wafer bonding operations including surface preparation (232). The assembly substrate and the SOI substrate are aligned (240) and a wafer bonding process is performed to join the two substrates and form a composite substrate structure (242).

Figure 4:
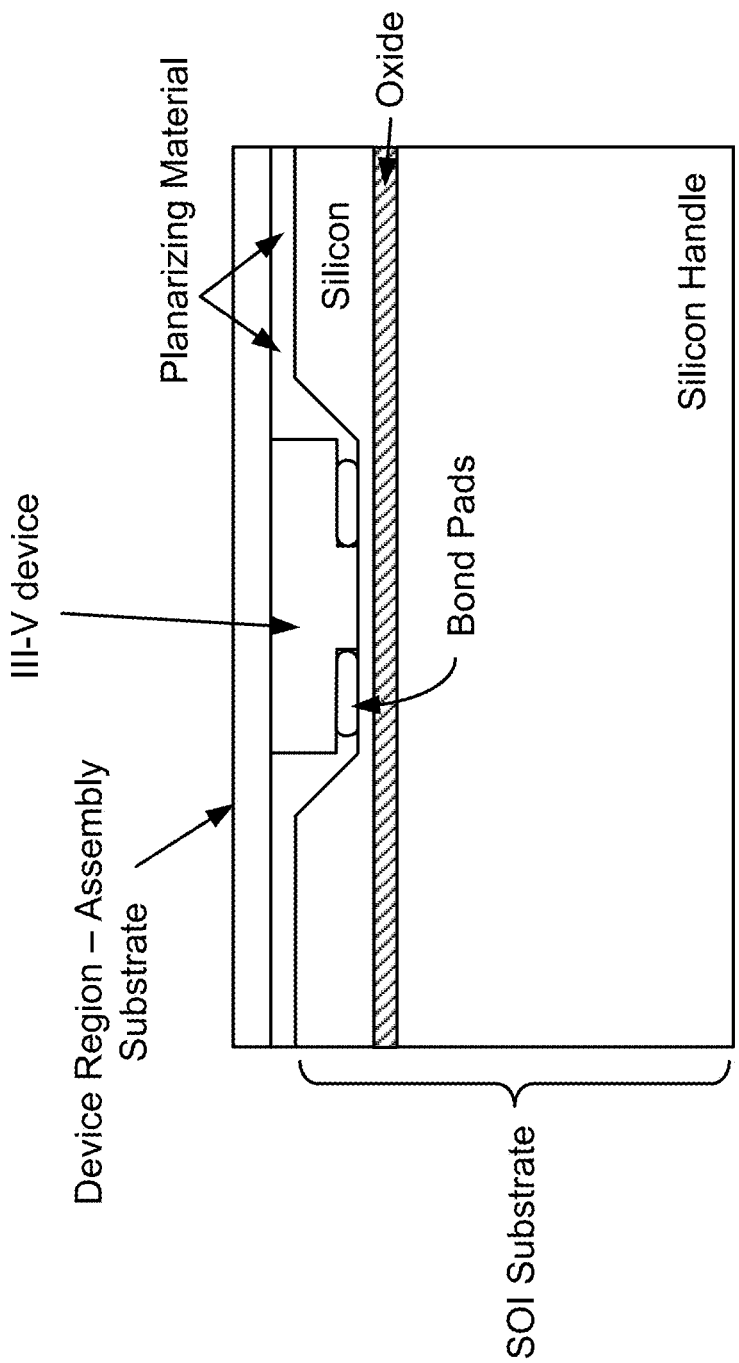
FIG. 4 is a simplified schematic diagram illustrating a portion of a composite substrate structure after wafer bonding, assembly substrate splitting, and polishing according to an embodiment of the present invention.

An anneal process is then used to split the assembly substrate at the depth at which the peak of the implant dose lies (244). In some embodiments, this step is omitted since the assembly substrate splits as a result of the wafer bonding process (242). In some embodiments, the substrate after splitting is polished (246) to remove surface roughness resulting from the splitting process. FIG. 4 is a simplified schematic diagram illustrating a portion of a composite substrate structure after wafer bonding, assembly substrate splitting, and polishing according to an embodiment of the present invention. Subsequent processing can also be performed to pattern optical waveguides in the device layer of the assembly substrate (248) and to form electrical interconnects (250). The bonds between the bond pads, the SOI substrate, and the III-V dies, as well as the bonds between the III-V dies and the SOI substrate can be metal-assisted bonds, semiconductor-semiconductor bonds, or the like, as described in U.S. patent application Ser. No. 12/902,621, referenced above.

Although the assembly substrate can be split at or near the depth of the implant dose peak, embodiments of the present invention are not limited to this particular split depth and other depths other than the peak of the implant dose can be achieved. Also, it should be noted that while splitting using an anneal process is described herein as a method of removing the assembly substrate, other methods are included within the scope of the present invention, for example, without limitation, lapping to remove the bulk of the assembly substrate, or other suitable techniques.

It should be appreciated that the specific steps illustrated in FIG. 2 provide a particular method of fabricating integrated optoelectronic devices according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
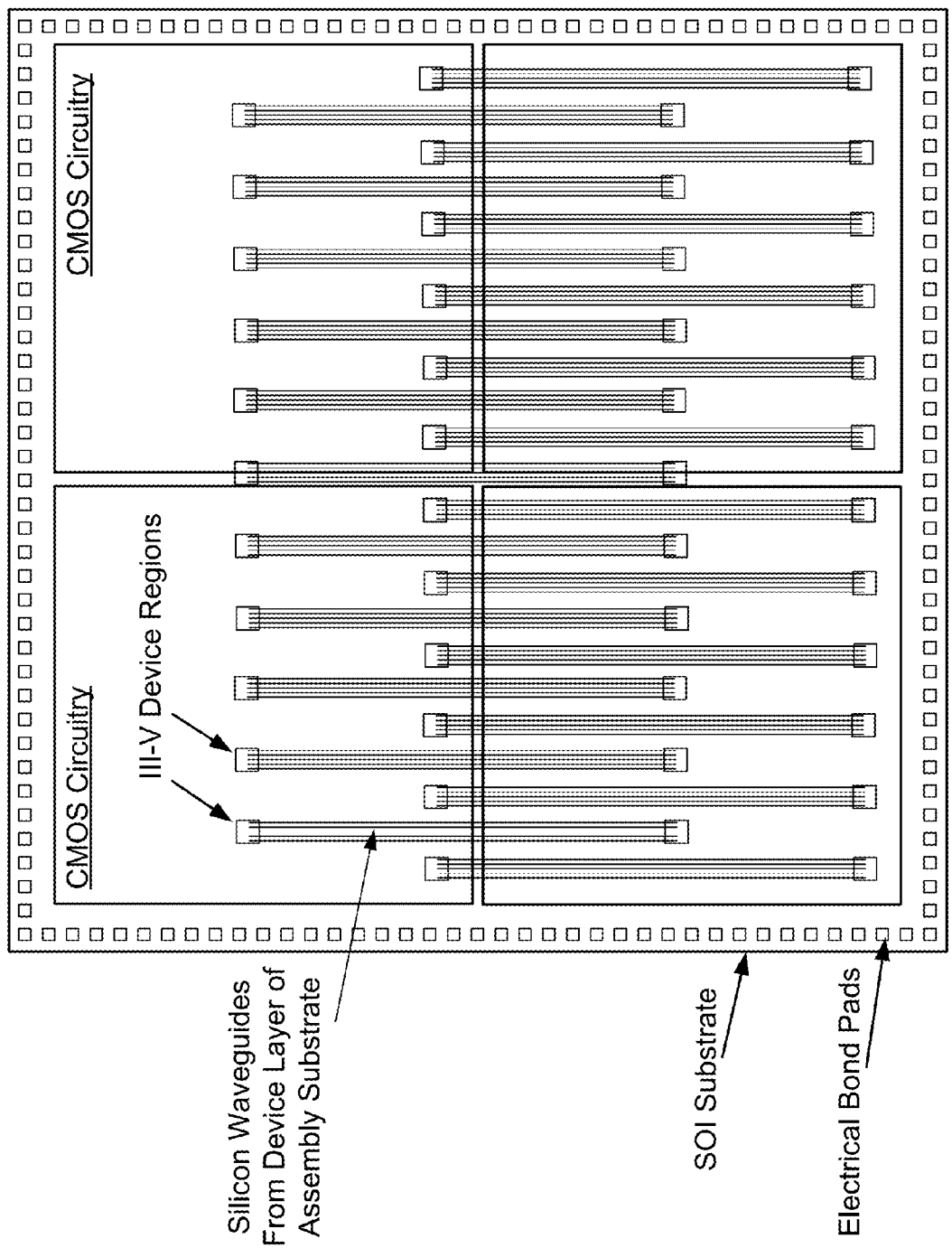
FIG. 5 is a simplified plan view of a substrate with integrated optoelectronic devices according to an embodiment of the present invention.

FIG. 5 is a simplified plan view of a substrate with integrated optoelectronic devices according to an embodiment of the present invention. Referring to FIG. 5, the SOI substrate is illustrated with electrical bond pads formed at peripheral portions of the SOI substrate. CMOS circuits are typically formed in the SOI substrate. Silicon waveguides formed in the device layer of the assembly substrate provide for optical communication between III-V devices located at the III-V device regions and CMOS elements formed in the SOI substrate and/or other III-V devices. As an example, four multi-core processors fabricated in the four illustrated portions of the CMOS circuitry region can be interconnected using optical waveguides optically coupled to the illustrated III-V devices.

Figure 6:
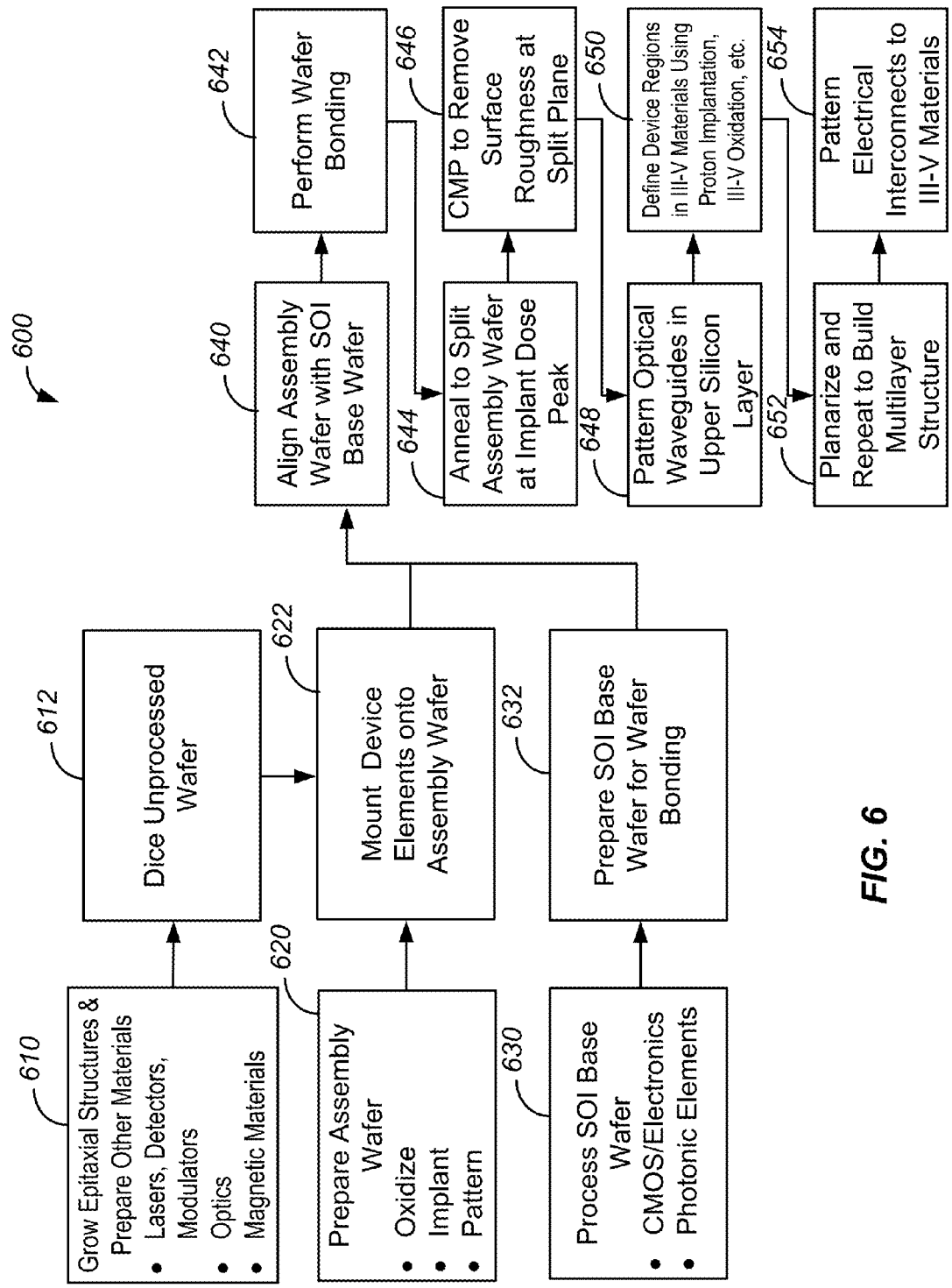
FIG. 6 is a simplified flowchart illustrating a method of fabricating integrated optoelectronic devices according to another embodiment of the present invention.

FIG. 6 is a simplified flowchart illustrating a method of fabricating integrated optoelectronic devices according to another embodiment of the present invention. In the embodiment illustrated in FIG. 6, unprocessed epitaxial material is thinned and attached to an assembly substrate for further processing. The method 600 includes growing epitaxial structures and preparing other materials (610) useful for lasers, detectors, modulator, optical elements, high-speed electronics, magnetic devices, or the like. These unprocessed wafers can be diced (612) to form device elements for further processing. The unprocessed wafers can be thinned after or as part of the epitaxial growth process.

An assembly wafer is prepared (620), for example by oxidizing, implanting, and patterning a silicon wafer to form a device layer and a base layer. In some embodiments, one or more of these steps are not performed as appropriate to the particular application. The device elements from the unprocessed wafer are mounted onto the assembly wafer (622). An SOI base wafer is processed (630), which can include the formation of CMOS circuits, electronics, and photonic elements and prepared for wafer bonding (632). In an embodiment, additional metals are deposited onto the SOI base wafer to form contact regions to the unprocessed epitaxial material during the wafer bonding process described below.

The assembly wafer and SOI base wafer are aligned (640) and wafer bonded (642). In an embodiment, the assembly wafer is aligned to the SOI base wafer, but this is not required by embodiments of the present invention. The assembly wafer is split using an anneal process, for example, at approximately the peak of the implant dose (644). A polishing process (e.g., CMP) is used to remove surface roughness resulting from the separation of the device layer of the assembly wafer from the base layer of the assembly substrate (646).

After the wafer bonding process and removal of the base layer of the assembly wafer, additional process steps such as patterning of the device layer to form optical waveguides (648) and proton implantation or III-V oxidation (650) may be performed to define active stripe regions on the epitaxial material. For example, during a proton implantation process, the energy of the implant is selected such that an implant through the "back" of the device structure (formed in the III-V material) defines the stripe region in the material adjacent to the bond to the SOI base wafer. Planarization of layers (652) and repeating of one or more of the steps illustrated in FIG. 6 can be used to build up a multilayer structure. Patterning of electrical interconnects to the III-V materials is performed in some embodiments (654).

In the embodiment illustrated in FIG. 6, epitaxial material is bonded and then post-processed to define stripe regions and interconnects to the regions on the processed SOI substrate that can include optics and have other traces defined on them. An advantage of the embodiment illustrated in FIG. 6 is the reduction or elimination of tight alignment tolerances associated with pre-defined features on the III-V devices. Thus, although the embodiment illustrated in FIG. 6 shares common elements with the embodiment illustrated in FIG. 3, the method illustrated in FIG. 6 may provide benefits not available using the method illustrated in FIG. 1. As an example, because the active stripe region is formed after bonding in the embodiment illustrated in FIG. 6, the alignment tolerance of both the process of attachment to the assembly wafer and the alignment of the assembly wafer to the SOI base wafer are substantially reduced (on the order of approximately ±1 µm to approximately ±10 µm).

It should be appreciated that the specific steps illustrated in FIG. 6 provide a particular method of fabricating integrated optoelectronic devices according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7A:
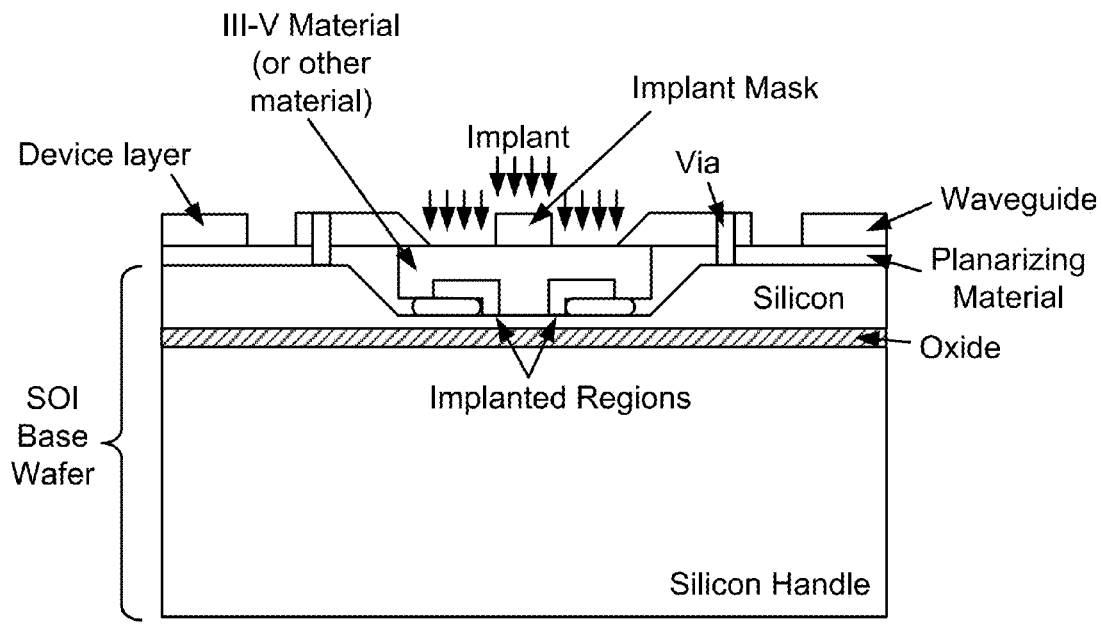
FIG. 7A is a simplified schematic diagram illustrating a portion of a composite substrate structure during device definition according to an embodiment of the present invention.

FIG. 7A is a simplified schematic diagram illustrating a portion of a composite substrate structure during device definition according to an embodiment of the present invention. As illustrated in FIG. 7A, the III-V device elements (or other materials) are bonded to the SOI base wafer such that the planarizing material may be under the device layer or above the device layer. In one process flow provided by embodiments of the present invention, openings are defined in the planarizing material that allow the III-V device to be bonded. Formation of the planarizing material under the device may occur if access regions in the template wafer allow the formation of this planarizing material subsequent to the patterning of the template wafer, but prior to definition of the implant mask. Regions are opened to access the III-V device and an implant mask is formed on the "back" side of the III-V device elements and as described above, the implant defines the active regions. After implantation, post-processing is performed to define interconnects, provide for planarization, and the like.

Figure 7B:
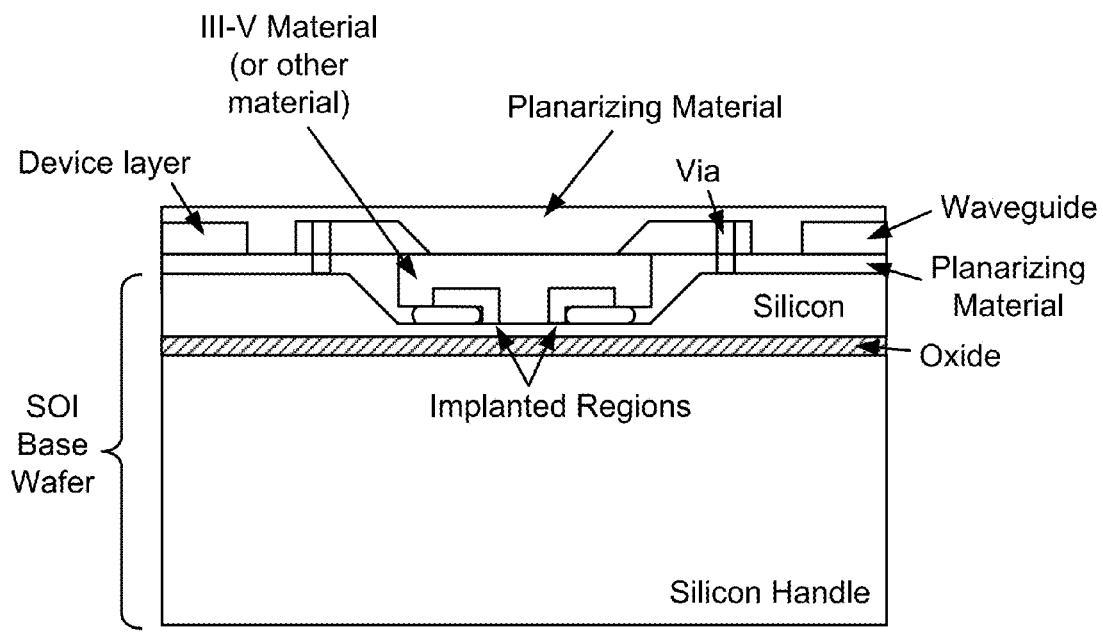
FIG. 7B is a simplified schematic diagram illustrating a portion of a composite substrate structure after processing according to an embodiment of the present invention.

FIG. 7B is a simplified schematic diagram illustrating a portion of a composite substrate structure after processing according to an embodiment of the present invention. As illustrated in FIG. 7B, the implant mask has been removed and an additional planarizing material has been deposited and planarized to provide passivation among other benefits.

Figure 7C:
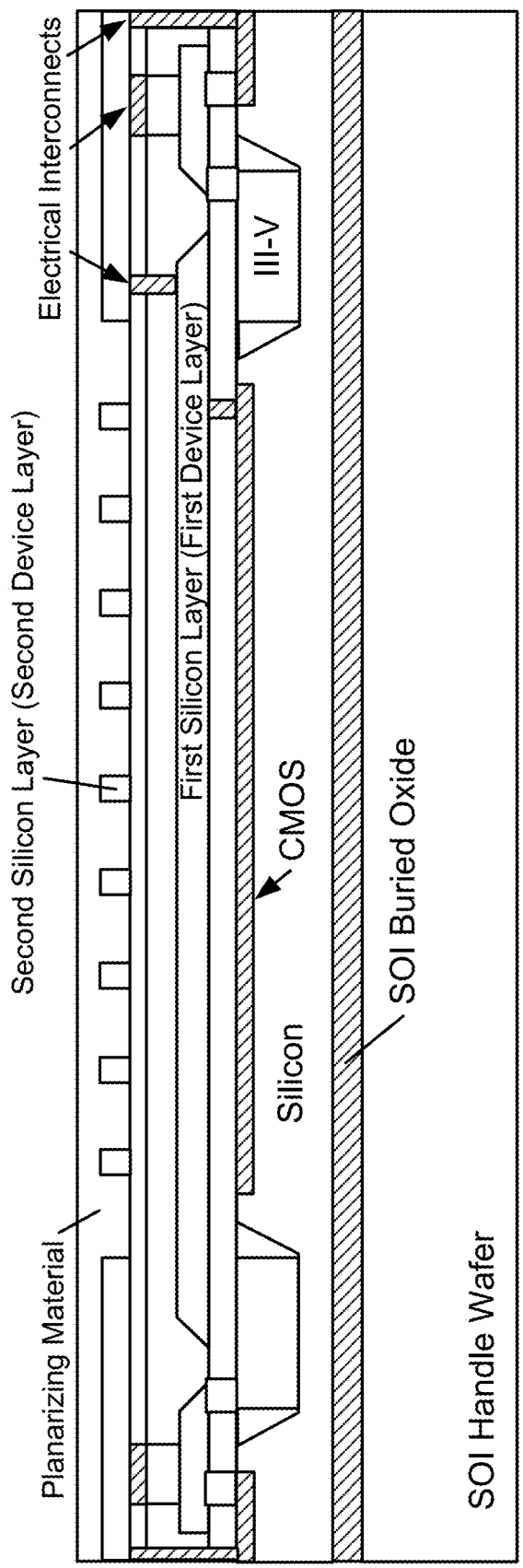
FIG. 7C is a simplified schematic diagram of a multilayer structure according to an embodiment of the present invention.

FIG. 7C is a simplified schematic diagram of a multilayer structure according to an embodiment of the present invention. As illustrated in the cross section in FIG. 7C, multiple levels of silicon and III-V materials are formed by using the embodiments described herein. Silicon layers can be used to create optical waveguides or can be patterned with vias to carry electrical connections to the III-V semiconductors or other materials in the layer stack. Utilizing embodiments of the present invention, it is possible to create circuits in the illustrated silicon device layers (originally from the assembly wafer), thus creating a "3-D" integrated optoelectronic circuit. One of ordinary skill in the art would recognize many variations, modifications, and alternatives.

Figure 8:
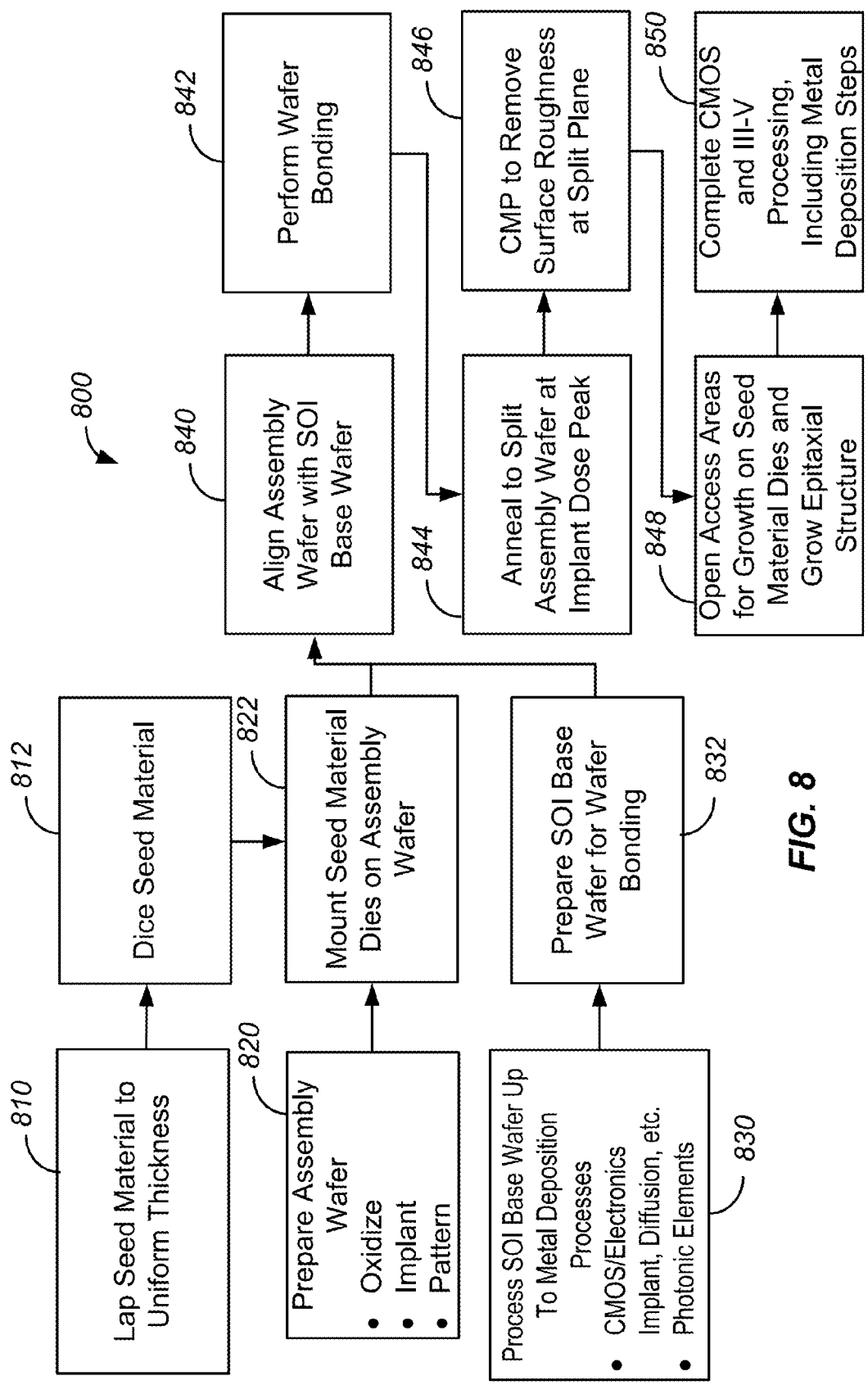
FIG. 8 is a simplified flowchart illustrating a method of performing heterogeneous epitaxial growth according to an embodiment of the present invention.

FIG. 8 is a simplified flowchart illustrating a method of performing heterogeneous epitaxial growth according to an embodiment of the present invention. The method 800 utilizes crystal "seeds" that are attached to the assembly wafer and then bonded to a processed wafer, for example, a silicon or SOI wafer using, for example, either direct wafer bonding or metal-assisted bonding. Metal assisted bonding is utilized in some embodiments since the metal layer helps to accommodate stress between materials with dissimilar thermal coefficients of expansion. The seed material may be any non-silicon crystalline material that is desired on the silicon, for example, InP or GaAs seed material or other suitable materials. Although an assembly wafer is utilized in the embodiment illustrated in FIG. 8, this is not required by the present invention and some embodiments dispense with the use of the assembly wafer and grow epitaxial material on a generic wafer having a dissimilar lattice constant. In other embodiments, III-V material mounted on an assembly wafer form a layer of seeds for epitaxial growth of III-V materials on an SOI wafer following high-temperature CMOS processing steps. One of ordinary skill in the art would recognize many variations, modifications, and alternatives.

Referring to FIG. 8, the method 800 includes lapping a seed material wafer to a uniform thickness (810). In some embodiments, the seed material wafer is received at a uniform thickness and step 810 is omitted. Seed material may also be lapped and polished to a uniform thickness subsequent to the mounting to the assembly wafer (822). The seed material wafer is diced (812) to provide a plurality of seed material dies. In various embodiments, the seed material is a III-V material, a II-VI material, a magnetic material, a non-linear optical material, or the like. An assembly wafer is prepared (820) and the seed material dies are mounted to the assembly wafer (822). During preparation of the assembly wafer (820), the oxidation, implant, and patterning steps may all be used or a subset may be used. For example, any or all steps may be eliminated depending upon the particular structure of the overall 3-D layer stack.

An SOI base wafer is processed up to, but not through, metal deposition processes (830) and the SOI base wafer is prepared for wafer bonding (832). In the illustrated embodiment, the SOI base wafer is processed up to the metal deposition processes, but this is not required by the embodiments of the present invention. In other embodiments, the SOI processing is stopped prior to steps preceding the metal deposition processes and these steps prior to the metal deposition processes are then performed after epitaxial growth (e.g., at step 850). One of ordinary skill in the art would recognize many variations, modifications, and alternatives.

Figure 9A:
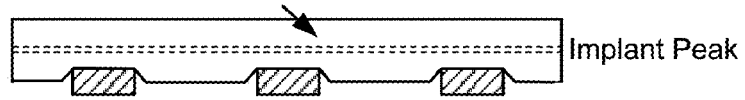
FIGS. 9A-9E are simplified schematic diagrams of a portion of a composite substrate structure at various fabrication stages according to an embodiment of the present invention.
Figure 9A:
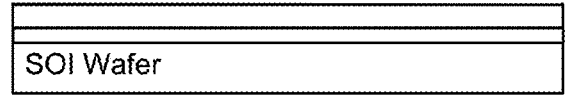

The assembly wafer is aligned with the SOI base wafer (840) and wafer bonding is performed to join the wafers together (842). FIG. 9A illustrates the implanted assembly wafer with the attached III-V seed dies aligned with the SOI wafer prior to wafer bonding. As described more fully below, the embodiment illustrated in FIGS. 9A-9E utilizes III-V seed crystals in a selective epitaxial growth process. As an example, rather than bonding an InP structure containing various epitaxial layers, a set of InP seed crystals are bonded to the assembly substrate, which is then bonded to an SOI substrate. Openings are made to expose the InP seed crystals, and selective epitaxy is performed define device regions (e.g., gain materials in a first region, detectors in another region, MZM devices in a third region, etc.), thus providing a generalized approach for selectively growing III-V materials on selected regions overlying silicon devices. Mixed seed materials may be used, for example InP and GaAs, III-V and II-VI material, or the like.

Figure 9B:
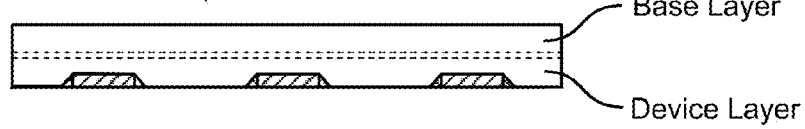
Figure 9B:
Figure 9C:
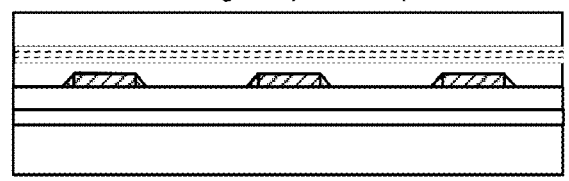
Figure 9D:
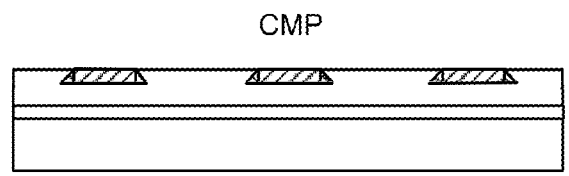

FIG. 9B illustrates the implanted assembly wafer after a CMP process is performed to planarize the surface of the seed dies and the device layer of the assembly wafer. Wafer bonding of the two wafers is illustrated in FIG. 9C. The assembly wafer is split at approximately the implant dose peak to form a device layer and a base layer in embodiments utilizing an implantation process. In other embodiments, the assembly wafer is polished to remove a portion of the assembly wafer. In the embodiment illustrated in FIG. 9D, a CMP process is used to remove surface roughness at the split plane. The base layer has been removed and is not illustrated in FIG. 9D. In some embodiments in which the processed devices are attached to the assembly wafer, the thickness tolerances of the III-V seed dies is controlled (e.g., by a polishing process) to provide for uniform bonding between bond sites on the SOI substrate and the III-V seed dies. In addition to CMP processing, a dry or wet chemical etch process could be used to open a hole above the III-V seeds to provide an area for epitaxial growth through the hole.

Figure 9E:
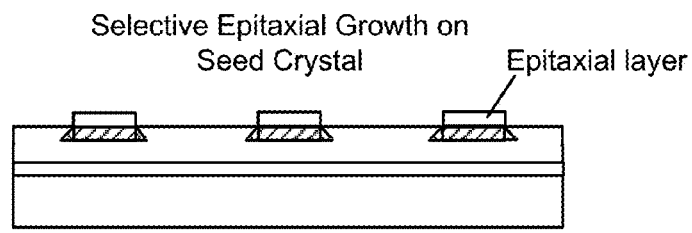

Access areas are opened for growth on the seed material dies (848) and epitaxial structures are grown using selective epitaxy as illustrated in FIG. 9E. The seed material may be accessed through wet or dry etching, CMP, or the like. Thus, although the seed material dies are mounted on an SOI wafer at this stage of the process, epitaxial growth of materials with a lattice constant dissimilar from silicon can be performed to form epitaxial materials lattice matched to the seed material dies. Thus, heterogeneous growth (III-V materials on a silicon substrate (e.g., an SOI substrate)) are provided by embodiments of the present invention.

After growth of epitaxial structures lattice matched to the seed material, the remainder of the CMOS processing, as well as processing of the seed materials (e.g., III-V materials) can be performed, including the metal deposition steps not performed in step 830. Different seed materials may be accessed at different points in the process for embodiments in which growth on multiple different seed materials is performed (for example, both GaAs and InP). Masking of predetermined portions of the substrate can be performed to access these varied seed materials.

In light of the applicability of the methods and systems described herein to different seed materials, it should be noted that embodiments of the present invention are therefore useful for applications where high-speed III-V devices or circuits are incorporated onto the silicon wafer and embodiments of the present invention are not limited to optical elements joined to the silicon substrate. As another example, embodiments of the present invention are useful for the fabrication of short-distance optical interconnects (e.g., core-to-core, chip-to-chip, or the like) that can be combined with longer-haul optical devices. Further examples might include integration of high-speed transistors for circuits (such as power amplifiers) with other circuits formed in CMOS for wireless communications applications.

The various steps illustrated in FIG. 8 can be repeated to form a multilevel structure as discussed in relation to FIG. 6. It should be appreciated that the specific steps illustrated in FIG. 8 provide a particular method of performing heterogeneous epitaxial growth according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

Utilizing the methods illustrated in reference to FIGS. 8 and 9A-9E, seed crystals are attached to the assembly substrate and then bonded to a silicon or SOI substrate using direct wafer bonding, metal-assisted bonding, or the like. Some embodiments utilize metal-assisted bonding since the metal layer will help to accommodate stress between materials with dissimilar TCEs. The seed material can be non-silicon crystalline materials that are integrated with silicon, for example, InP, GaAs, other III-Vs, II-VIs, or other suitable seed material. In an alternative embodiment, the assembly substrate is not used and epitaxial structures are formed on a substrate having a dissimilar lattice constant. As illustrated, the seed material may be accessed through wet or dry etching, CMP, or the like.

Different seed crystals may be provided and/or accessed at different points in the process if growth on multiple different seed materials is desired (for example, both GaAs and InP or a II-VI). The use of multiple seed materials will be useful for applications in which high-speed III-V devices or circuits are incorporated onto the silicon structure. Thus, embodiments of the present invention are not limited to optical interconnection applications. As another example, this process would be applicable to the combination of short-distance optical interconnects (e.g., core-to-core, chip-to-chip) with longer-haul optical devices.

FIG. 10 is a simplified schematic diagram of a multilayer structure fabricated according to an embodiment of the present invention. In the embodiment illustrated in FIG. 10, an SOI substrate including CMOS devices is provided including SOI base wafer 1024, buried oxide (BOX) layer 1022, silicon layer 1020 and CMOS circuitry. A silicon device layer 1018 is joined to the SOI substrate and epitaxial layer 1016 is grown on seed crystals integrated with the silicon device layer 1018. Planarizing material in the plane of the device layer 1018 is illustrated.

Subsequent device layers and epitaxial layers are illustrated making up the multilayer structure. These layers are formed through repeating the template assisted bonding process with additional templates having seed material, epitaxial material, or the like. For example, template wafers with seed material 1014 and 1012 can be bonded sequentially. Etched openings in the template wafer provide access for selective area growth of epitaxial structures. Vias and interconnects may also be formed between and within the layers. Additional electronic devices or circuits may also be formed on the template wafers in the stack.

Thus, multilayer structures are fabricated using the seed crystal approach described herein. As illustrated in FIG. 10, multiple levels of electronics (e.g., CMOS circuits) are fabricated in the silicon device layers that are separated from the various assembly wafers as the structure is built up layer by layer. Although growth of III-Vs on silicon is illustrated, other embodiments utilize other material systems such as GaN on Sapphire and other lattice mismatched structures. In an embodiment, the growth of the final III-V epitaxial material is performed on seed crystals regions on SOI wafer. One of ordinary skill in the art would recognize many variations, modifications, and alternatives.

FIGS. 11A-11D are simplified schematic diagrams of a portion of a composite substrate structure at various fabrication stages according to another embodiment of the present invention. The composite substrate structure illustrated in FIGS. 11A-11D shares some common elements with other structures described herein and the description provided throughout the present specification is applicable as appropriate to this composite substrate structure.

Figure 11A:
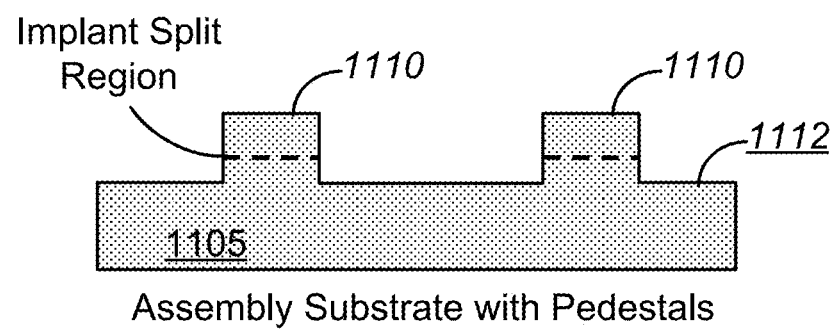
FIGS. 11A-11D are simplified schematic diagrams of a portion of a composite substrate structure at various fabrication stages according to another embodiment of the present invention.

Referring to FIG. 11A, an assembly wafer is provided with one or more pedestals. In some embodiments, the assembly substrate 1105 is referred to as a template substrate or an assembly/template wafer. One or more pedestals 1110 are formed on the surface of the assembly substrate extending to a predetermined height in a direction normal to the surfaces of the assembly substrate. The height of the pedestals enables for physical separation between the assembly substrate and the SOI substrate to which the assembly substrate is bonded as will be described in additional detail below. Although only a set of pedestals are illustrated, it will be appreciated that an arbitrary number of pedestals or arbitrary shape can be formed according to embodiments of the present invention.

Referring once again to FIG. 11A, the pedestals 1110 extend to a height greater than the depth at which the implant split region is formed in the assembly substrate. Thus, the implant split regions pass through the pedestals at a predetermined distance from the top of the pedestal 1110 of the assembly substrate. Referring to FIG. 2, processes performed in relation to process 220 can be utilized to prepare the assembly substrate with pedestals. Alternatively, formation of pedestals can be added to the processes performed in process 220. Additionally, as described below, the pedestals can also be formed after mounting of the plurality of elements on the pedestals, which shares similarities with process 222. The plurality of pedestals, although only shown in cross-section in FIG. 11A, extend to a predetermined depth into the plane of the figure, providing a two-dimensional shape when viewed in a plan view. The two-dimensional shape can be modified in accordance with the two-dimensional shape of the elements bonded to the tops of the pedestals as described more fully below.

Formation of the pedestals can include a masking and etching process or other suitable removal process to define the lateral and vertical extent of the pedestals. In the illustrated embodiment, all pedestals are the same height, but it will be evident to one of skill in the art that multiple masking and etching processes can be utilized to form pedestals of varying height dispersed on the surface of the assembly substrate. Moreover, inclusion of etch stop layers (not shown) in the assembly substrate can be utilized to terminate the removal process and define the height of the pedestals.

Figure 11B:
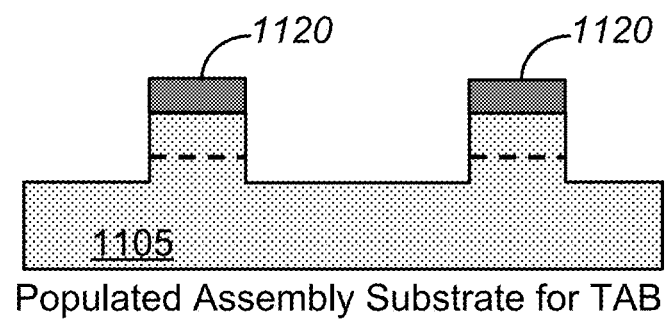

As illustrated in FIG. 11B, a plurality of elements 1120 are attached to each of the pedestals. In the illustrated embodiment, the elements are of a second material that is different from the material of the assembly substrate. As an example, the assembly substrate can be fabricated in silicon and the elements could be III-V dies. Elements suitable for mounting on the pedestals is provided, for example, in relation to the description for processes 210, 212, and 222 in FIG. 2. As examples, the plurality of elements can include III-V devices, such as lasers, optical gain media, detectors, modulators, optical elements, or the like. In addition, the plurality of elements can include other materials that can be processed to form magnetic device elements for devices such as optical circulators or isolators, non-linear materials, other optoelectronic elements, and the like.

The plurality of elements 1120 can be attached to the pedestals of the assembly substrate before the pedestals are formed or after the pedestals are formed, depending on the particular implementation. Although the lateral extent of the elements and the pedestals are illustrated as approximately the same, this is not required by the present invention and the lateral extent of the pedestals and the elements can be the same, the pedestals can be smaller than the elements, the pedestals can be larger than the elements, combinations thereof, or the like.

Referring to FIG. 3D, the use of pedestals as illustrated in FIG. 11A provides an alternative to the planar device layer 312 to which the III-V device matrix is attached. In the embodiment illustrated in FIG. 11A, pedestals formed in either or both of the base layer 310 and/or the device layer 312 support the III-V device matrix at a predetermined height from the base layer 310 prior to bonding to the SOI substrate.

Figure 11C:
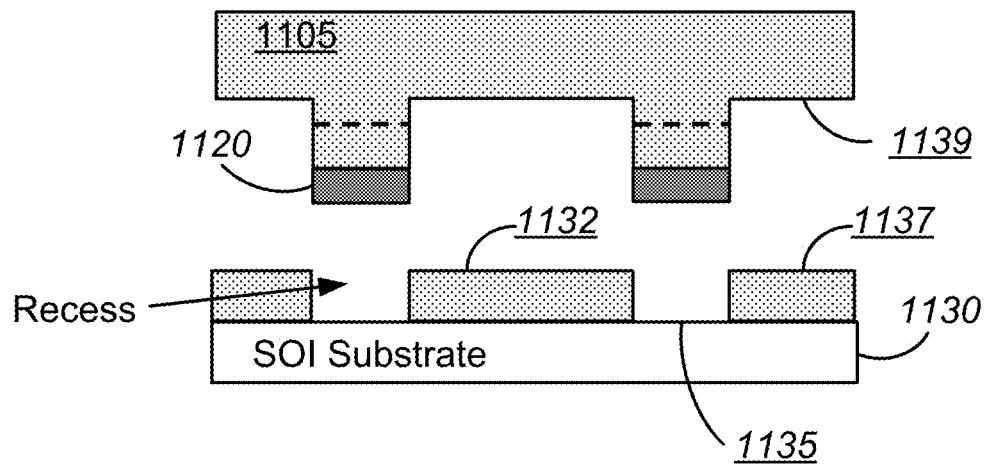
Figure 11D:
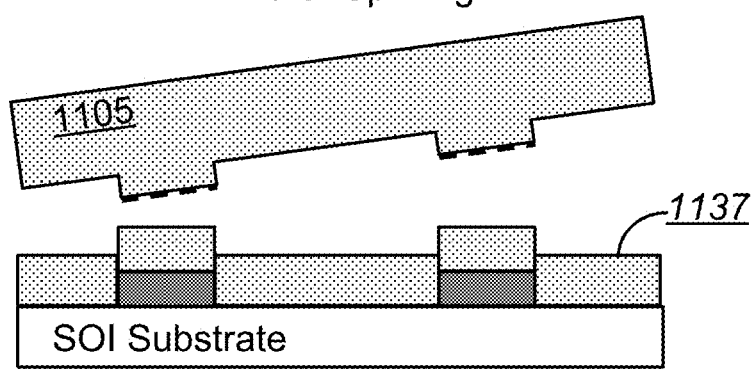

Referring to FIG. 11C, the assembly substrate 1105 with pedestals and mounted elements 1120 are aligned with the SOI substrate 1130. As described in relation to process 230 in FIG. 2, the SOI substrate can be processed to include a variety of devices and elements. These can include optical structures, integrated circuits, microprocessors, memory, and the like. In some embodiments, recessed regions are formed on the processed SOI substrate (also referred to as a device wafer), but this is not required by the present invention. In some implementations, as illustrated in FIG. 11C, recessed regions matching one or more of the elements of the plurality of elements are defined in the SOI substrate. The recessed regions can provide integration of optically active devices fabricated using the second material with optically passive devices fabricated using the first material, for example, silicon waveguides can be formed in the SOI substrate in regions between the recessed regions and lasers/detectors can be mounted in the same plane as the waveguides as illustrated in FIG. 11D. Of course, the in-plane integration of waveguides and active optical elements is merely one example.

Referring to FIGS. 11C and 11D, the assembly substrate and the SOI substrate are joined to form a composite substrate structure. Bonding surfaces 1135 on the SOI substrate are joined to elements 1120. The use of the pedestal to support the elements results in surfaces 1137 not being bonded, but free of bonding regions. In contrast with some techniques, embodiments of the present invention only bond the plurality of elements during the transfer process, preventing bonding between surfaces, for example, surface 1139 of the assembly substrate and 1137 of the SOI substrate. Accordingly, requirements typically applicable to the substrate surfaces can be relaxed using embodiments of the present invention. Referring to FIG. 11C, areas such as portions adjacent surface 1137 are free from bonding, enabling placement of device elements to which bonding is not desired, for example, integrated circuits, photonic circuits, optical elements, and the like, which are not adversely impacted by a bonding structure in these embodiments. The unbounded regions on one or both wafers are thus protected from flaking of material onto the opposing substrate.

The use of the pedestals also provides relaxation of tolerances associated with processing of the SOI substrate. As an example, differences in the heights of surfaces 1132 and 1137 would typically adversely impact wafer bonding processes if they were not equal since it is generally desirable in wafer bonding processes to have a uniform height surface for bonding. However, here, since neither surface 1132 nor 1137 include bonding regions, height differentials, material non-planarity, and the like have little to no impact on the wafer bonding process. In some implementations, intentional height variations in the SOI substrate are accommodated by the use of the pedestals, recessed regions formed in the SOI substrate, or a combination thereof.

Splitting of the substrate at the implant split region is illustrated in FIG. 11D. In some embodiments, wafer splitting to remove the assembly substrate 1105 is performed followed by processing of the assembly substrate in order to recycle the assembly substrate for future use. In other embodiments, processing of the SOI substrate with the attached elements can be performed as appropriate to the particular application. As an example, portions of the pedestals adjacent the implant split plane, illustrated as extending above surface 1137 can be removed using a CMP process or other suitable process. One of ordinary skill in the art would recognize many variations, modifications, and alternatives.

In addition to modification of FIG. 2 to incorporate the use of pedestals as part of the template assisted bonding process, other processes described herein can be modified to provide an assembly substrate with pedestals. As an example, processes described in relation to FIG. 6 can be modified to utilize an assembly substrate with pedestals. In this example, process 620 can be modified to fabricate an assembly substrate with pedestals to which the device elements are attached in order to provide a process in which the unprocessed dies are attached to the pedestals after pedestal formation. Alternatively, in a process in which the pedestals are formed after die attachment, an additional step between process 622 and 640 would be added to form the pedestals prior to bonding to the SOI substrate (642). Moreover, modification of processes illustrated in FIG. 8 can be performed to utilize an assembly substrate with pedestals. As an example, process 820 can be modified to prepare an assembly substrate with pedestals to which the seed material dies are mounted or attached. In this example, all or portions of the pedestals can be removed along with other features including source roughness in process 846. One of ordinary skill in the art would recognize many variations, modifications, and alternatives.

Figure 12:
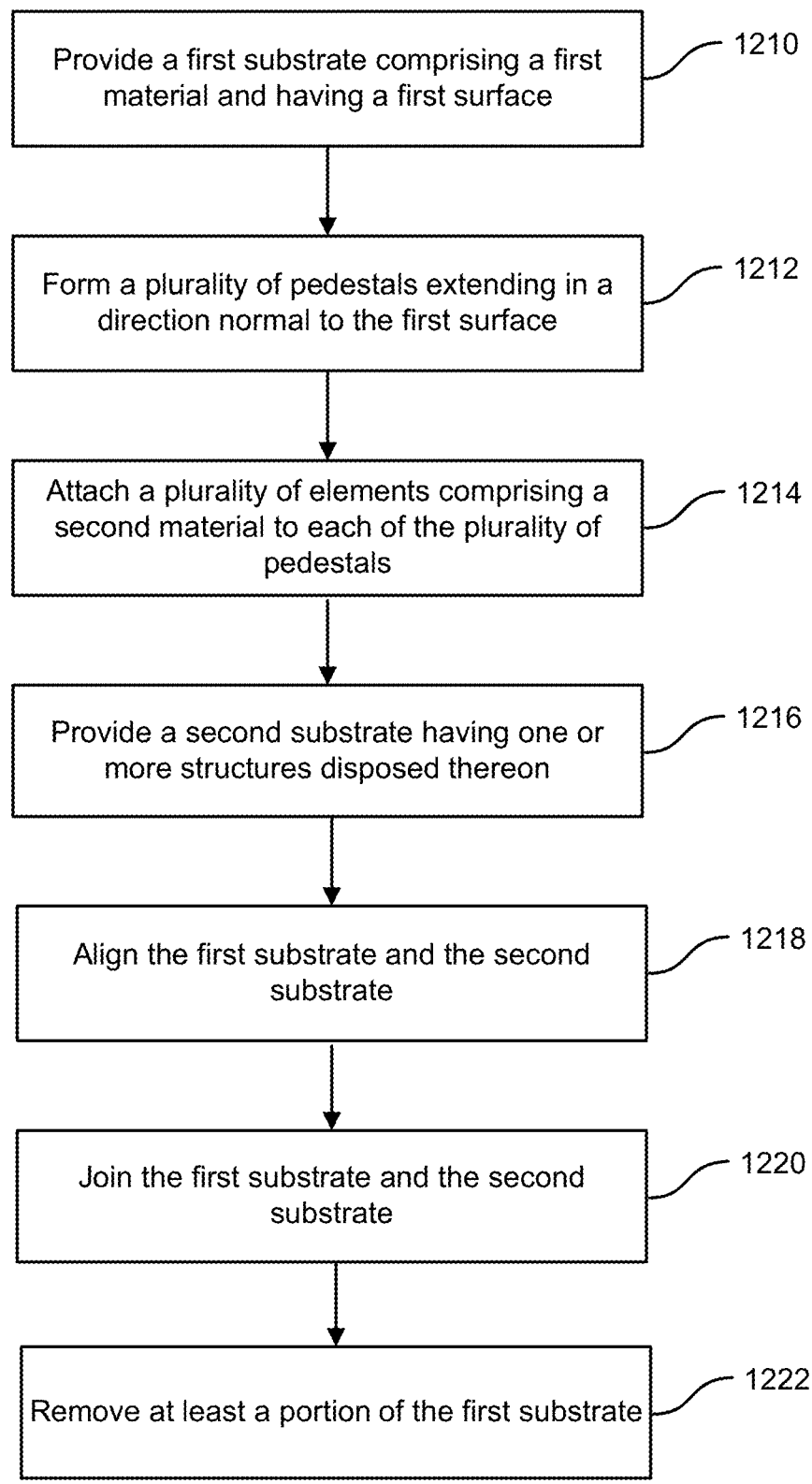
FIG. 12 is a simplified flowchart illustrating a method of performing template assisted bonding using pedestals according to an embodiment of the present invention.

FIG. 12 is a simplified flowchart illustrating a method of performing template assisted bonding using pedestals according to an embodiment of the present invention. As discussed in relation to FIGS. 11A-11D, a bonding process utilizing one or more pedestals, preferably a plurality of pedestals, is utilized to provide increased system functionality in comparison with other techniques.

As described herein, a wafer bonding and splitting process for the transferring of materials/devices/membranes onto a second wafer is provided. In a particular embodiment, only regions of interest are transferred during the wafer or substrate bonding process. As described herein, a plurality of pedestal-like regions are defined on the assembly substrate. In some embodiments, pedestals can also be formed on the SOI substrate. The pedestals can align with matching features present on the other substrate in some embodiments. In an embodiment, subsequently, the assembly substrate and the SOI substrate are bonded so that only the top regions of the pedestals (including materials attached on tops of the pedestal) are in contact with the second wafer (i.e., the SOI substrate), preserving regions of the second wafer free from bonded structures. As a result, elements present on the second substrate (e.g., optical devices, electrical integrated circuits, optoelectronic circuits and/or devices, or the like) are protected during the bonding process by some embodiments. Additionally, as described above, constraints on the bonding process are relaxed as the number of different materials utilized in the bonding process are reduced.

In some wafer bonding processes, the entire wafer surfaces are bonded to one another prior to wafer splitting. According to some embodiments of the present invention, only portions of the wafer surfaces are bonded to one another utilizing pedestal-like structures that are defined prior to bonding. Thus, only these regions are in contact with one another during bonding. This allows for portions or all of the unbonded surface to stay unaffected by the bond and split process. As an example, wafers that contain regions with devices that do not utilize material transfer can remain unaffected from regions that utilize material transfer. Also, by not bonding the entire surface of the wafer or substrate, embodiments enable the use of surface conditions that are suboptimal/inadequate for wafer bonding.

Referring to FIG. 12, the method of performing template assisted bonding using pedestals to fabricate a composite semiconductor structure includes providing a first substrate comprising a first material and having a first surface (1210) and forming a plurality of pedestals extending to a predetermined height in a direction normal to the first surface (1212). Forming the plurality of pedestals can include a masking and etching process or other suitable process effective to remove portions of the first substrate. The method also includes attaching a plurality of elements comprising a second material to each of the plurality of pedestals (1214) and providing a second substrate having one or more structures disposed thereon (1216). The second material can include at least one of III-V materials, ferromagnetic materials, or nonlinear optical materials, enabling formation of a composite substrate structure with both Group IV elements (e.g., passive optical elements) and Group III-V elements (e.g., active optical elements). In some embodiments, the one or more structures on the second substrate include at least one of optical elements or integrated circuits, which can be implemented using CMOS processes.

The method further includes aligning the first substrate and the second substrate (1218), joining the first substrate and the second substrate to form the composite substrate structure (1220), and removing at least a portion of the first substrate from the composite substrate structure (1222).

In some embodiments, the method includes forming a wafer splitting region in the first substrate, for example, an implanted region in which an implant species such as hydrogen, helium, or boron (or a combination thereof) has been implanted. Removing at least a portion of the first substrate from the composite substrate structure can include using a wafer splitting process to separate portions of the first substrate. In some implementations, the second substrate can include a plurality of recessed regions. In these embodiments, aligning the first substrate and the second substrate includes inserting one or more of the plurality of elements into the plurality of recessed regions. As an example, the recessed regions could be formed adjacent a waveguide section, enabling optical coupling between an active device fabricated using one of the plurality of elements and the waveguide section. Recessed regions (for pairing with the pedestals) on the second substrate are thus utilized in some embodiments.

In an embodiment, the use of pedestals enables regions of the second substrate to remain free from bonding processes. As a result, the second substrate can include a plurality of device regions and joining the first substrate and the second substrate to form the composite substrate structure can include forming an unbonded region adjacent to the plurality of device regions. In these and other embodiments, the plurality of device regions can include at least one of a waveguide, an electronic device, an optical device, or an integrated circuit.

It should be appreciated that the specific steps illustrated in FIG. 12 provide a particular method of performing template assisted bonding using pedestals according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 13:
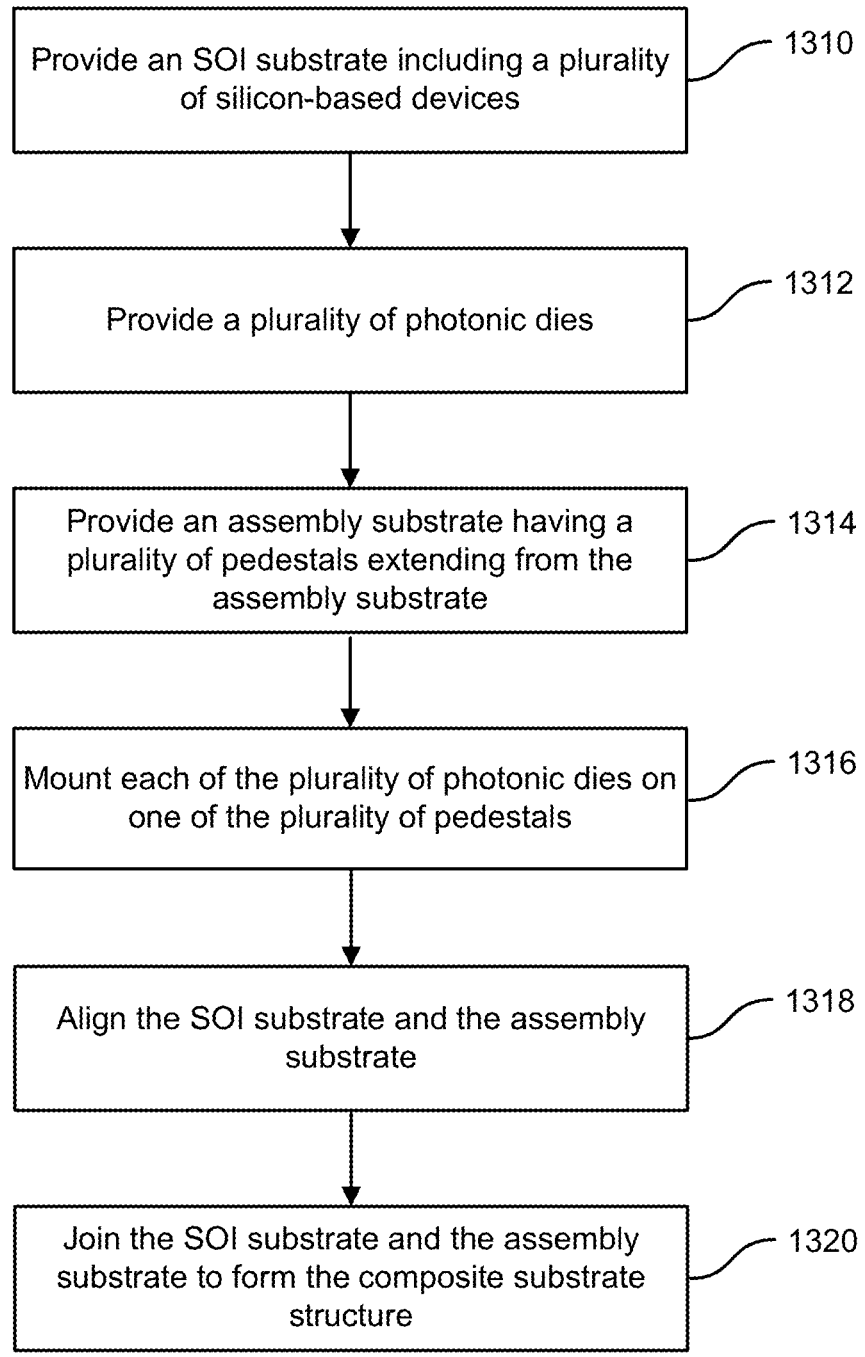
FIG. 13 is a simplified flowchart illustrating a method of fabricating a composite semiconductor structure according to another embodiment of the present invention.

FIG. 13 is a simplified flowchart illustrating a method of fabricating a composite semiconductor structure according to another embodiment of the present invention. The method includes providing an SOI substrate including a plurality of silicon-based devices (e.g., CMOS devices) (1310) and providing a plurality of photonic dies, each photonic die including one or more photonics devices (1312). In a particular embodiment, providing a plurality of photonic dies includes providing a compound semiconductor substrate including a plurality of photonic devices and dicing the compound semiconductor substrate to provide the plurality of photonic dies. As an example, the compound semiconductor substrate can be a III-V wafer and may include electronic devices as well as optical devices. Exemplary photonic devices include lasers, detectors, modulators, or the like.

The method also includes providing an assembly substrate having a plurality of pedestals extending to a predetermined height from the assembly substrate (1314) and mounting each of the plurality of photonic dies on one of the plurality of pedestals (1316). As an example, providing the assembly substrate can include oxidizing a silicon substrate and implanting the oxidized silicon substrate to form an implant region disposed between a top of the plurality of pedestals and the silicon substrate. In some embodiments, mounting of each of the plurality of photonic dies on one of the plurality of pedestals is performed after formation of the plurality of pedestals on the assembly substrate.

The method further includes aligning the SOI substrate and the assembly substrate (1318) and joining the SOI substrate and the assembly substrate to form the composite substrate structure (1320).

In some embodiments, the method may also include removing at least a portion of the assembly substrate from the composite substrate structure, for example, using a wafer splitting process.

It should be appreciated that the specific steps illustrated in FIG. 13 provide a particular method of fabricating a composite semiconductor structure according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

It should be noted that III-V devices discussed herein may have other than photonic functions. For example, embodiments of the present invention can be used to bond III-V materials for high-speed devices such as cell phone power amplifiers onto a silicon or SOI wafer with other functions. Other non-photonic applications are included within the scope of the present invention as well.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of fabricating a multilevel semiconductor structure, the method comprising:

providing a first substrate including a first plurality of devices;

providing a second substrate including a second plurality of devices;

dicing the second substrate to provide a plurality of dies, each die including one or more of the second plurality of devices;

providing a third substrate;

mounting the plurality of dies on predetermined portions of the third substrate;

aligning the first substrate and the third substrate;

joining the first substrate and the third substrate to form a composite structure;

removing at least a portion of the third substrate from the composite structure;

providing a fourth substrate;

aligning the fourth substrate with the composite structure after providing the fourth substrate; and joining the fourth substrate and the composite structure, after aligning the fourth substrate with the composite structure, to form a semiconductor structure having multiple levels.

2. The method of fabricating the multilevel semiconductor structure as recited in claim 1, wherein the first substrate is a silicon-on-insulator (SOI) substrate.

3. The method of fabricating the multilevel semiconductor structure as recited in claim 1, wherein the first plurality of devices are silicon-based devices.

4. The method of fabricating the multilevel semiconductor structure as recited in claim 1, wherein the first plurality of devices comprise photonic dies.

5. The method of fabricating the multilevel semiconductor structure as recited in claim 1, wherein the second substrate is a compound semiconductor substrate.

6. The method of fabricating the multilevel semiconductor structure as recited in claim 1, further comprising removing at least a portion of the fourth substrate from the semiconductor structure having multiple levels.

7. The method of fabricating the multilevel semiconductor structure as recited in claim 1, wherein:

the plurality of dies is a first plurality of dies; and the method further comprises mounting a second plurality of dies on predetermined portions of the fourth substrate before joining the fourth substrate and the composite structure.

8. The method of fabricating the multilevel semiconductor structure as recited in claim 1, wherein the fourth substrate comprises silicon.

9. The method of fabricating the multilevel semiconductor structure as recited in claim 1, further comprising forming an electrical interconnect in the composite structure.

10. The method of fabricating the multilevel semiconductor structure as recited in claim 1, further comprising:

providing a fifth substrate;

aligning the fifth substrate with the semiconductor structure having multiple levels; and joining the fifth substrate with the semiconductor structure having multiple levels.

11. The method of fabricating the multilevel semiconductor structure as recited in claim 10, wherein the first substrate, the fourth substrate, and the fifth substrate comprise silicon.

12. The method of fabricating the multilevel semiconductor structure as recited in claim 1, wherein the plurality of dies are seed dies and the method further comprises growing material on the seed dies.

13. The method of fabricating the multilevel semiconductor structure as recited in claim 1, further comprising forming CMOS devices in the fourth substrate.

* * * * *